US012598895B2

(12) United States Patent
Kim

(10) Patent No.: US 12,598,895 B2
(45) Date of Patent: Apr. 7, 2026

(54) DISPLAY APPARATUS AND METHOD OF MANUFACTURING THE SAME

(71) Applicant: SAMSUNG DISPLAY CO., LTD.,
Yongin-si (KR)

(72) Inventor: Donghwan Kim, Yongin-si (KR)

(73) Assignee: SAMSUNG DISPLAY CO., LTD.,
Gyeonggi-Do (KR)

( * ) Notice: Subject to any disclaimer, the term of this patent is extended or adjusted under 35 U.S.C. 154(b) by 285 days.

(21) Appl. No.: 18/214,393

(22) Filed: Jun. 26, 2023

(65) Prior Publication Data

US 2023/0422582 A1     Dec. 28, 2023

(30) Foreign Application Priority Data

Jun. 27, 2022     (KR) ........................ 10-2022-0078480

(51) Int. Cl.
*H10K 59/80*     (2023.01)
*H10K 59/12*     (2023.01)
*H10K 71/50*     (2023.01)
*H10K 77/10*     (2023.01)
*H10K 102/00*     (2023.01)

(52) U.S. Cl.
CPC ....... *H10K 59/873* (2023.02); *H10K 59/1201* (2023.02); *H10K 71/50* (2023.02); *H10K 77/111* (2023.02); *H10K 2102/311* (2023.02)

(58) Field of Classification Search
CPC .. H10K 59/1201; H10K 59/873; H10K 71/00; H10K 71/50; H10K 71/231; H10K 2102/311; H10K 77/111
See application file for complete search history.

(56) References Cited

U.S. PATENT DOCUMENTS

| | | | |
|---|---|---|---|
| 10,490,755 B2 | 11/2019 | Jang et al. | |
| 2018/0162095 A1 | 6/2018 | Lim et al. | |
| 2021/0373604 A1 | 12/2021 | Shin et al. | |
| 2022/0077242 A1 | 3/2022 | Yoon et al. | |

(Continued)

FOREIGN PATENT DOCUMENTS

| | | | | |
|---|---|---|---|---|
| CN | 107283075 A | * 10/2017 | ............. | B23K 26/18 |
| CN | 112133733 A | 12/2020 | | |

(Continued)

OTHER PUBLICATIONS

Translation CN-107283075A, Yuan, Oct. 2017. (Year: 2017).*

*Primary Examiner* — Philip C Tucker
*Assistant Examiner* — Jimmy R Smith, Jr.
(74) *Attorney, Agent, or Firm* — CANTOR COLBURN LLP

(57)     ABSTRACT

A display apparatus includes a display panel including a central area, a corner area defined at a corner of the central area, and a middle area between the central area and the corner area, and an upper organic layer disposed on the display panel, where the corner area includes a first extension area and a second extension area, the first extension area extends in a direction away from the central area, the second extension area extends in the direction away from the central area and is spaced apart from the first extension area, and the upper organic layer includes a first upper organic layer extension area overlapping the first extension area and a second upper organic layer extension area overlapping the second extension area.

6 Claims, 25 Drawing Sheets

(56)                    References Cited

U.S. PATENT DOCUMENTS

| 2022/0102462 | A1  | 3/2022  | Zhou et al. | |
|---|---|---|---|---|
| 2022/0118731 | A1  | 4/2022  | Shin et al. | |
| 2022/0216276 | A1* | 7/2022  | Lee | H10K 59/131 |
| 2023/0107898 | A1  | 4/2023  | Lee et al. | |
| 2025/0107427 | A1* | 3/2025  | Lee | H10K 59/12 |

FOREIGN PATENT DOCUMENTS

| KR | 1020180033364 | A | 4/2018  |
|---|---|---|---|
| KR | 1020180068382 | A | 6/2018  |
| KR | 1020190037600 | A | 4/2019  |
| KR | 1020210146482 | A | 12/2021 |
| KR | 1020220034278 | A | 3/2022  |
| KR | 1020220050299 | A | 4/2022  |
| KR | 1020230048207 | A | 4/2023  |

* cited by examiner

DISPLAY APPARATUS AND METHOD OF MANUFACTURING THE SAME

This application claims priority to Korean Patent Application No. 10-2022-0078480, filed on Jun. 27, 2022, and all the benefits accruing therefrom under 35 U.S.C. § 119, the content of which in its entirety is herein incorporated by reference.

BACKGROUND

1. Field

One or more embodiments relate to a display apparatus and a method of manufacturing the display apparatus, and more particularly, to a display apparatus, in which the possibility of occurrence of defects in a process of manufacturing the display apparatus may be reduced, and a method of manufacturing the display apparatus.

2. Description of the Related Art

A display apparatus may be an electronic device, such as a mobile phone or a tablet personal computer (PC), or a portion of an electronic device, and provides a user with visual information such as images or video. The display apparatus has been developed to have a structure in which a portion of a display unit is bent in a way such that an image may also be displayed even at a side surface or a corner of the display apparatus. The display apparatus may include a display panel with a protective layer attached therebelow, and the protective layer attached to a lower portion of the display panel may include a silicon-based compound so that the display panel may be easily bent at a side surface or a corner thereof.

SUMMARY

In a conventional display apparatus having a structure in which a portion of a display unit is bent, cracks may be easily generated in a display panel thereof during bending of the display apparatus.

One or more embodiments include a display apparatus, in which the possibility of occurrence of defects in a process of manufacturing operation may be reduced, and a method of manufacturing the display apparatus. However, these problems are exemplary, and the scope of the disclosure is not limited thereto.

According to one or more embodiments, a display apparatus includes a display panel including a central area, a corner area defined at a corner of the central area, and a middle area between the central area and the corner area, and an upper organic layer disposed on the display panel, where the corner area includes a first extension area and a second extension area, the first extension area extends in a direction away from the central area, the second extension area extends in the direction away from the central area and is spaced apart from the first extension area, and the upper organic layer includes a first upper organic layer extension area overlapping the first extension area and a second upper organic layer extension area overlapping the second extension area.

In an embodiment, the second upper organic layer extension area may be spaced apart from the first upper organic layer extension area, and the upper organic layer may not be disposed in a space between the first upper organic layer extension area and the second upper organic layer extension area.

In an embodiment, the display apparatus may further include an upper organic layer adhesive layer between the display panel and the upper organic layer, and the upper organic layer adhesive layer may be integrally provided over the first extension area, the second extension area, and a separation area between the first extension area and the second extension area.

In an embodiment, the upper organic layer adhesive layer may include a first groove overlapping the separation area and disposed on an upper surface of the upper organic layer adhesive layer.

In an embodiment, a modulus of the upper organic layer may be in a range of about 1 gigapascal (GPa) to about 2 GPa.

In an embodiment, the upper organic layer may include at least one selected from polyethylene terephthalate (PET), polyimide, polyethylene naphthalate, polyarylate, polycarbonate, polyetherimide (PEI), and polyethersulfone.

In an embodiment, the display apparatus may further include a lower organic layer disposed below the display panel, and a lower organic layer adhesive layer between the display panel and the lower organic layer.

In an embodiment, the lower organic layer may be integrally provided below the first extension area, the second extension area, and a separation area between the first extension area and the second extension area, and the lower organic layer adhesive layer may be integrally provided below the first extension area, the second extension area, and the separation area.

In an embodiment, the lower organic layer may include polydimethylsiloxane.

In an embodiment, the lower organic layer may include a first lower organic layer extension area overlapping the first extension area and a second lower organic layer extension area overlapping the second extension area, and the lower organic layer adhesive layer may be integrally provided over the first extension area, the second extension area, and a separation area between the first extension area and the second extension area.

In an embodiment, the second lower organic layer extension area may be spaced apart from the first lower organic layer extension area, and the lower organic layer may not be disposed in a space between the first lower organic layer extension area and the second lower organic layer extension area.

In an embodiment, the lower organic layer adhesive layer may include a second groove overlapping the separation area and disposed on a lower surface of the lower organic layer adhesive layer.

In an embodiment, a modulus of the lower organic layer may be in a range of about 1 GPa to about 2 GPa.

In an embodiment, the lower organic layer may include at least one selected from polyethylene terephthalate (PET), polyimide, polyethylene naphthalate, polyarylate, polycarbonate, polyetherimide (PEI), and polyethersulfone.

In an embodiment, the display panel may further include a first area and a second area, where the first area may be adjacent to the central area in a first direction, the second area may be adjacent to the central area in a second direction, and the corner area may be between the first area and the second area.

In an embodiment, the display apparatus may further include a cover window disposed on the upper organic layer.

According to one or more embodiments, a method of manufacturing a display apparatus includes preparing a display panel, where a corner area of the display panel comprises a first extension area and a second extension area, attaching a guide film to the display panel, pre-shaping the display panel by applying an external force to the guide film, and attaching a cover window to the display panel, wherein the preparing of the display panel includes attaching an upper organic layer, to which an upper organic layer adhesive layer is attached, to an upper surface of the display panel, forming a first upper organic layer extension area overlapping the first extension area and a second upper organic layer extension area overlapping the second extension area by cutting a portion of the upper organic layer on the corner area of the display panel using a laser beam, and attaching a lower organic layer, to which a lower organic layer adhesive layer is attached, to a lower surface of the display panel.

In an embodiment, the forming the first upper organic layer extension area and the second upper organic layer extension area may include forming the first upper organic layer extension area and the second upper organic layer extension area by cutting the upper organic layer along a separation area defined between the first extension area and the second extension area using the laser beam.

In an embodiment, the forming the first upper organic layer extension area and the second upper organic layer extension area may include forming a first groove on an upper surface of the upper organic layer adhesive layer by half-cutting the upper organic layer adhesive layer along the separation area using the laser beam.

In an embodiment, the preparing the display panel may include forming a first lower organic layer extension area overlapping the first extension area, and a second lower organic layer extension area overlapping the second extension area, by cutting a portion of the lower organic layer below the corner area of the display panel using a laser beam.

In an embodiment, the forming the first lower organic layer extension area and the second lower organic layer extension area may include forming the first lower organic layer extension area and the second lower organic layer extension area by cutting the lower organic layer along a separation area defined between the first extension area and the second extension area using the laser beam.

In an embodiment, the forming the first lower organic layer extension area and the second lower organic layer extension area may further include forming a second groove on a lower surface of the lower organic layer adhesive layer by half-cutting the lower organic layer adhesive layer along the separation area using the laser beam.

Features other than those described above will now become apparent from the following drawings, claims, and the detailed description of the disclosure.

BRIEF DESCRIPTION OF THE DRAWINGS

The above features of certain embodiments of the disclosure will be more apparent from the following description taken in conjunction with the accompanying drawings, in which.

DETAILED DESCRIPTION

Figure 1A:
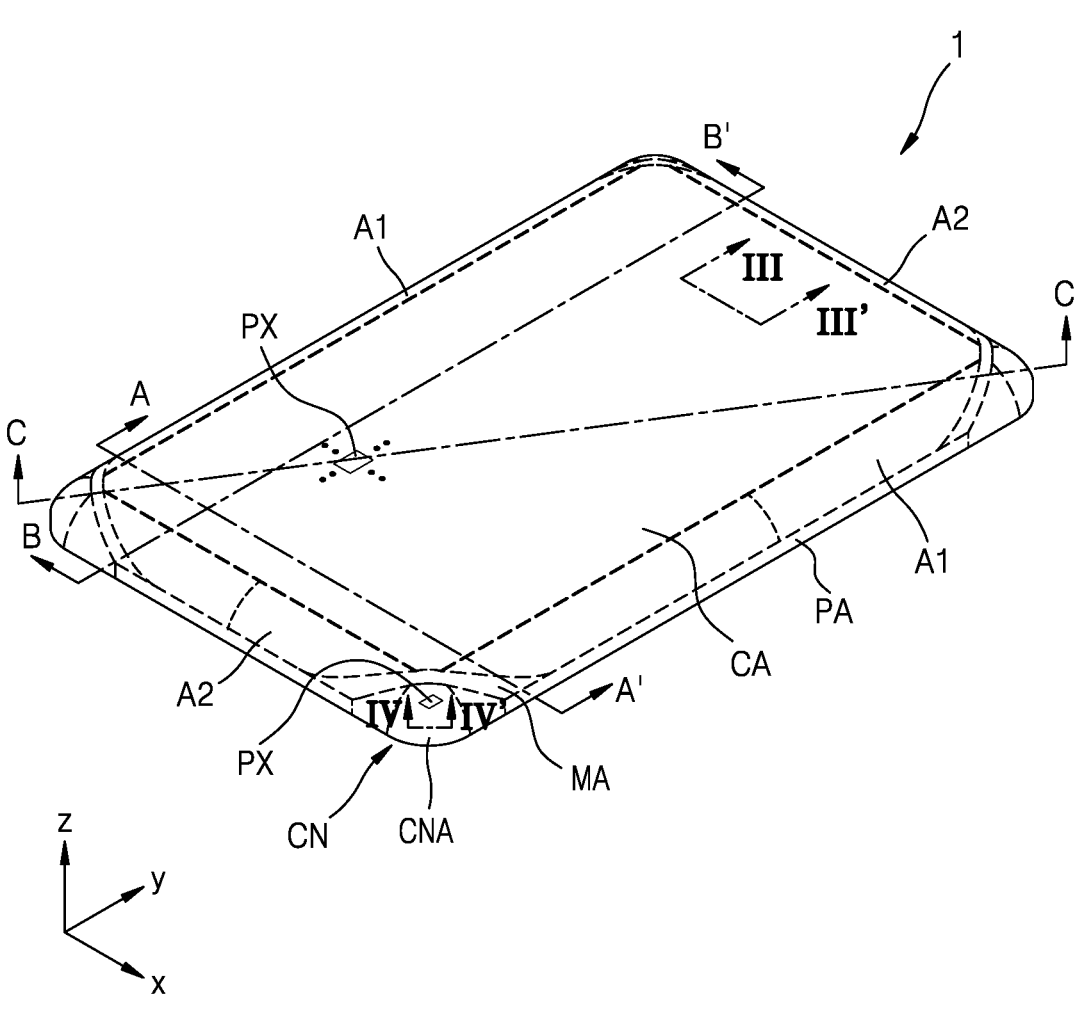
FIG. 1A is a perspective view schematically illustrating a portion of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the exemplary embodiments set forth herein.

Sizes of components in the drawings may be exaggerated for convenience of explanation. In other words, since sizes and thicknesses of components in the drawings are arbitrarily illustrated for convenience of explanation, the following embodiments are not limited thereto.

The x, y, and z axes in the drawings are not limited to three axes on the orthogonal coordinates system, and may be interpreted in a broad sense including the same. For example, the x-axis, the y-axis, and the z-axis may be perpendicular to one another, or may represent different directions that are not perpendicular to one another.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described more fully with reference to the accompanying drawings, in which embodiments of the disclosure are shown. Like reference numerals in the drawings denote like elements, and thus any repetitive detailed description thereof may be omitted or simplified.

Figure 1B:
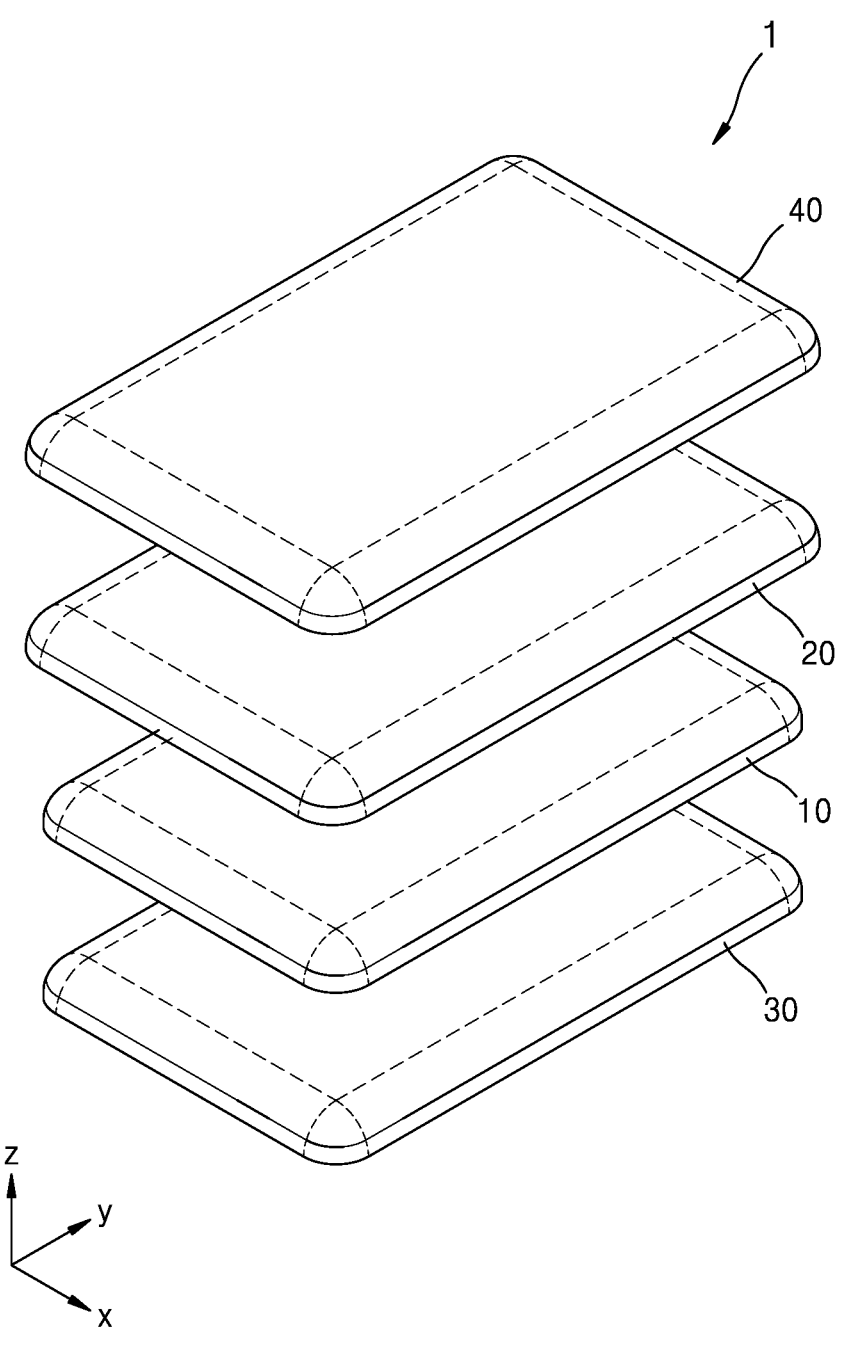
FIG. 1B is an exploded perspective view schematically illustrating a portion of a display apparatus according to an embodiment.
Figure 2A:
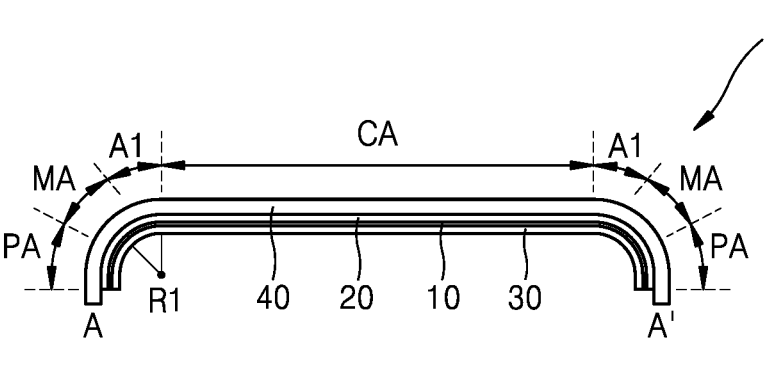
FIG. 2A is a schematic cross-sectional view of the display apparatus, taken along line A-A' of FIG. 1A.
Figure 2A:
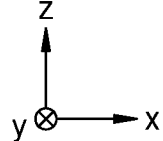
Figure 2B:
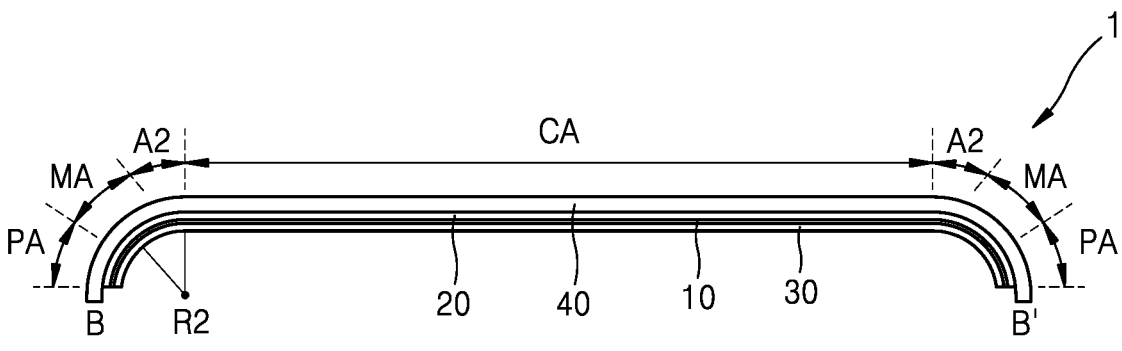
FIG. 2B is a schematic cross-sectional of the display apparatus, taken along line B-B' of FIG. 1A.
Figure 2B:
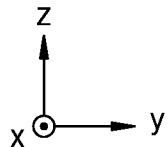
Figure 2C:
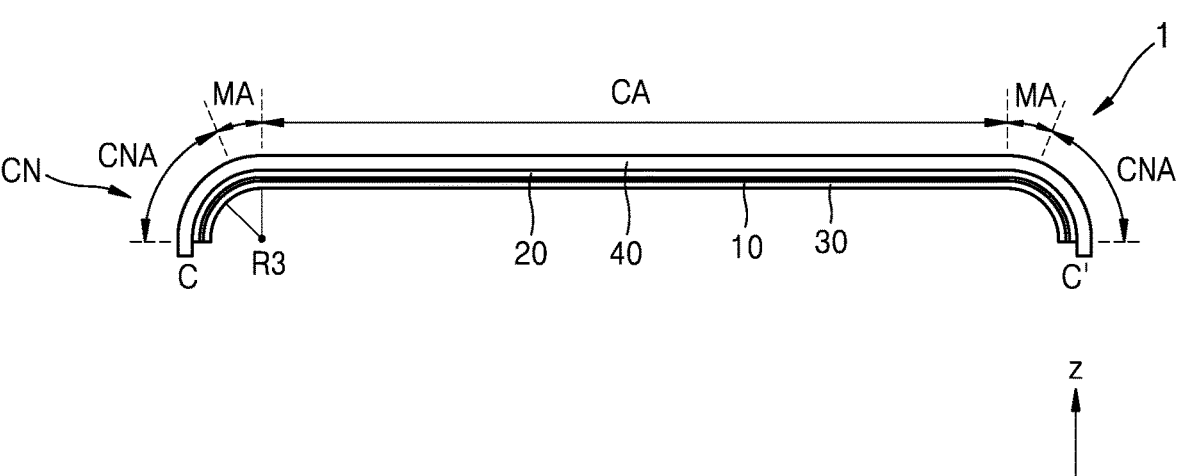
FIG. 2C is a schematic cross-sectional view of the display apparatus, taken along line C-C' of FIG. 1A.

FIG. 1A is a perspective view schematically illustrating a portion of a display apparatus 1 according to an embodiment, and FIG. 1B is an exploded perspective view schematically illustrating a portion of the display apparatus 1 according to an embodiment. FIG. 2A is a schematic cross-sectional view of the display apparatus 1, taken along line A-A' of FIG. 1A, FIG. 2B is a schematic cross-sectional of the display apparatus 1, taken along line B-B' of FIG. 1A, and FIG. 2C is a schematic cross-sectional view of the display apparatus 1, taken along line C-C' of FIG. 1A.

The display apparatus 1 is an apparatus which displays a video or a still image, and may be a portable electronic device, such as a mobile phone, a smart phone, a tablet personal computer (PC), a mobile communication terminal, an electronic notebook, an electronic book, a portable multimedia player (PMP), a navigation device, an Ultra Mobile PC (UMPC), or the like. The display apparatus 1 may be an electronic device such as a television, a laptop computer, a monitor, a billboard, an Internet of Things (IoT) device, or the like. Alternatively, the display apparatus 1 may be a wearable device such as a smart watch, a watch phone, a glasses-type display, or a head-mounted display (HMD). Alternatively, the display apparatus 1 may be a portion of another device. In an embodiment, for example, the display apparatus 1 may be a display unit of an electronic device. Alternatively, the display apparatus 1 may be a dashboard of a vehicle, a center fascia of a vehicle or a center information display (CID) disposed on a dashboard, a room mirror display replacing a side mirror of a vehicle, and a display unit disposed on a back surface of a front seat as entertainment for a back seat of a vehicle.

Referring to FIGS. 1A, 1B, and 2A to 2C, the display apparatus 1, which may display an image, may have an edge extending in a first direction and an edge extending in a second direction. Here, the first direction and the second direction may be directions crossing each other. In an embodiment, for example, an angle formed by the first direction and the second direction may be an acute angle. Alternatively, an angle formed by the first direction and the second direction may be an obtuse angle or a right angle. Hereinafter, for convenience of description, embodiments in which an angle formed by the first direction and the second direction is a right angle will be mainly described. In an embodiment, for example, the first direction may be an x direction or a –x direction, and the second direction may be a y direction or a –y direction.

A corner CN where an edge extending in the first direction (e.g., an x direction or –x direction) and an edge extending in the second direction (a y direction or –y direction) meet may have a certain curvature.

As shown in FIGS. 1B, and 2A to 2C, an embodiment of the display apparatus 1 may include a display panel 10, an upper organic layer 20, a lower organic layer 30, and a cover window 40. For convenience of illustration, adhesive layers between the display panel 10 and the upper organic layer 20, between the display panel 10 and the lower organic layer 30, and between the upper organic layer 20 and the cover window 40 are not shown in FIGS. 1B, and 2A to 2C. The display apparatus 1 may include a central area CA, a first area A1, a second area A2, a corner area CNA, a middle area MA, and a peripheral area PA. The central area CA may be a flat area. The display apparatus 1 may provide most of images in the central area CA.

The first area A1 may be adjacent to the central area CA in the first direction (e.g., the x direction or –x direction). The first area A1 may extend in the second direction (e.g., the y direction or –y direction). The display apparatus 1 may be bent in the first area A1. That is, the first area A1 may be defined as an area which is bent at a cross-section (e.g., a zx cross-section) in the first direction, unlike the central area CA. On the other hand, the first area A1 may not be bent at a cross-section (e.g., an yz cross-section) in the second direction. That is, the first area A1 may be an area that is bent around an axis extending in the second direction.

Although FIG. 2A illustrates an embodiment where the first area A1 positioned in the x direction from the central area CA and the first area A1 positioned in the –x direction from the central area CA have a same curvature as each other, the disclosure is not limited thereto. In an alternative embodiment, for example, the first area A1 positioned in the x direction from the central area CA and the first area A1 positioned in the –x direction from the central area CA may have different curvatures from each other.

The second area A2 may be adjacent to the central area CA in the second direction. The second area A2 may extend in the first direction. The display apparatus 1 may be bent in the second area A2. That is, the second area A2 may be defined as an area which is bent at a cross-section (e.g., the yz cross-section) in the second direction, unlike the central area CA. On the other hand, the second area A2 may not be bent at a cross-section (e.g., the zx cross-section) in the first direction. That is, the second area A2 may be an area that is bent around an axis extending in the first direction.

Although FIG. 2B illustrates an embodiment where the second area A2 positioned in the y direction from the central area CA and the second area A2 positioned in the –y direction from the central area CA have a same curvature as each other, the disclosure is not limited thereto. In an alternative embodiment, for example the second area A2 positioned in the y direction from the central area CA and the second area A2 positioned in the –y direction from the central area CA may have different curvatures from each other.

The display apparatus 1 may be bent in the corner area CNA. The corner area CNA may be an area in which the corner CN is arranged. That is, the corner area CNA may be an area where an edge of the display apparatus 1 in the first direction meets an edge of the display apparatus 1 in the second direction. The corner area CNA may at least partially surround the central area CA, the first area A1, and the second area A2. Alternatively, the corner area CNA may at least partially surround the central area CA, the first area A1, the second area A2, and the middle area MA.

As described above, when the first area A1 extends in the second direction and is bent at a cross-section (e.g., the zx cross-section) in the first direction, and the second area A2 extends in the first direction and is bent at a cross-section (e.g., the yz cross-section) in the second direction, at least a portion of the corner area CNA may be bent at both of a cross-section (e.g., the zx cross-section) in the first direction and a cross-section (e.g., the yz cross-section) in the second direction. That is, at least a portion of the corner area CNA may be a double curved area in which a plurality of curvatures in a plurality of directions overlap each other. The display apparatus 1 may have a plurality of corner areas CNA.

The middle area MA may be positioned between the central area CA and the corner area CNA. The middle area MA may extend in a direction, in which the first area A1 extends, between the first area A1 and the corner area CNA. The middle area MA may also extend in a direction, in which the second area A2 extends, between the second area A2 and the corner area CNA. The middle area MA may be bent. Also, a driving circuit for providing an electrical signal to a pixel PX may be arranged in the middle area MA, and in addition, a power supply line for providing power to the pixel PX may be arranged in the middle area MA. In an embodiment, the pixel PX arranged in the middle area MA may overlap the driving circuit and/or the power supply line.

The peripheral area PA may be positioned outside the central area CA. In an embodiment, the peripheral area PA may be positioned outside the first area A1 and the second area A2. The peripheral area PA may be bent. Also, the pixel PX may not be arranged in the peripheral area PA. That is, the peripheral area PA may be a non-display area that does not display an image. A driving circuit for providing an electrical signal to the pixel PX or a power supply line for providing power to the pixel PX may be arranged in the peripheral area PA.

As shown in FIG. 2A, a portion of the peripheral area PA, the middle area MA, and the first area A1 may have a first radius of curvature R1 and may be bent. As shown in FIG. 2B, other portions of the peripheral area PA, the middle area MA, and the second area A2 may have a second radius of curvature R2 and may be bent. As shown in FIG. 2C, the corner area CNA and the middle area MA may have a third radius of curvature R3 and may be bent.

The pixel PX may be implemented as a display element. Each of pixels PX may include a red sub-pixel, a green sub-pixel, and a blue sub-pixel. Alternatively, each of pixels PX may include a red sub-pixel, a green sub-pixel, a blue sub-pixel, and a white sub-pixel.

The pixel PX may be arranged in at least one of the central area CA, the first area A1, the second area A2, the corner area CNA, and the middle area MA. In an embodiment, for example, a plurality of pixels PX may be arranged in the central area CA, the first area A1, the second area A2, the corner area CNA, and the middle area MA. Accordingly, the display apparatus 1 may display an image in the central area CA, the first area A1, the second area A2, the corner area CNA, and the middle area MA. In an embodiment, the display apparatus 1 may respectively provide independent images in the central area CA, the first area A1, the second area A2, the corner area CNA, and the middle area MA. Alternatively, the display apparatus 1 may respectively provide portions of any one image in the central area CA, the first area A1, the second area A2, the corner area CNA, and the middle area MA.

In such an embodiment, as described above, the display apparatus 1 may display an image not only in the central area CA but also in the first area A1, the second area A2, the middle area MA, and the corner area CNA. Accordingly, the area occupied by a display area, which is an area that displays an image, in the display apparatus 1 may be substantially increased. In such an embodiment, because the display apparatus 1 may display an image even at the corner CN, aesthetics appeal of the display apparatus 1 may be improved.

The upper organic layer 20 may be disposed on an upper portion of the display panel 10 to face an upper surface (in a +z direction) of the display panel 10. Here, the 'upper surface' of the display panel 10 may be defined as a surface facing a direction in which the display panel 10 provides an image. The upper organic layer 20 may adjust a stress applied to the display panel 10. An adhesive layer may be between the upper organic layer 20 and the display panel 10. Through such an adhesive layer, the upper organic layer 20 may be attached to the upper portion of the display panel 10.

The lower organic layer 30 may be disposed on a lower portion of the display panel 10 to face a lower surface (in a −z direction) of the display panel 10. The lower organic layer 30 may protect the display panel 10 in an operation of manufacturing the display apparatus 1. An adhesive layer may be between the lower organic layer 30 and the display panel 10. Through such an adhesive layer, the lower organic layer 30 may be attached to the lower portion of the display panel 10.

The cover window 40 may be disposed above the display panel 10. In an embodiment, the cover window 40 may be disposed on the upper organic layer 20. The cover window 40 may be arranged to cover the upper portion of the display panel 10. The cover window 40 may protect an upper surface of the display panel 10. In such an embodiment, because cover window 40 forms the exterior of the display apparatus 1, the cover window 40 may include a flat surface and a curved surface, which correspond to the shape of the display apparatus 1. The cover window 40 may have a high transmittance to transmit light emitted from the display panel 10, and may have a thin thickness to minimize the weight of the display apparatus 1. In addition, the cover window 40 may have strong strength and hardness to protect the display panel 10 from external impact. The cover window 40 may be a flexible window. The cover window 40 may protect the display panel 10 while being easily bent by an external force without occurrence of cracks or the like. An adhesive layer may be between the cover window 40 and the upper organic layer 20. Through such an adhesive layer, the cover window 40 may be attached to an upper portion of the display panel 10.

An image displayed by the display panel 10 may be provided to a user through the cover window 40, which is transparent. That is, an image provided by the display apparatus 1 may be implemented by the display panel 10. Accordingly, the central area CA, the first area A1, the second area A2, the corner area CNA, the middle area MA, and the peripheral area PA of the display apparatus 1 described above may be understood as being included in the display panel 10.

Figure 3:
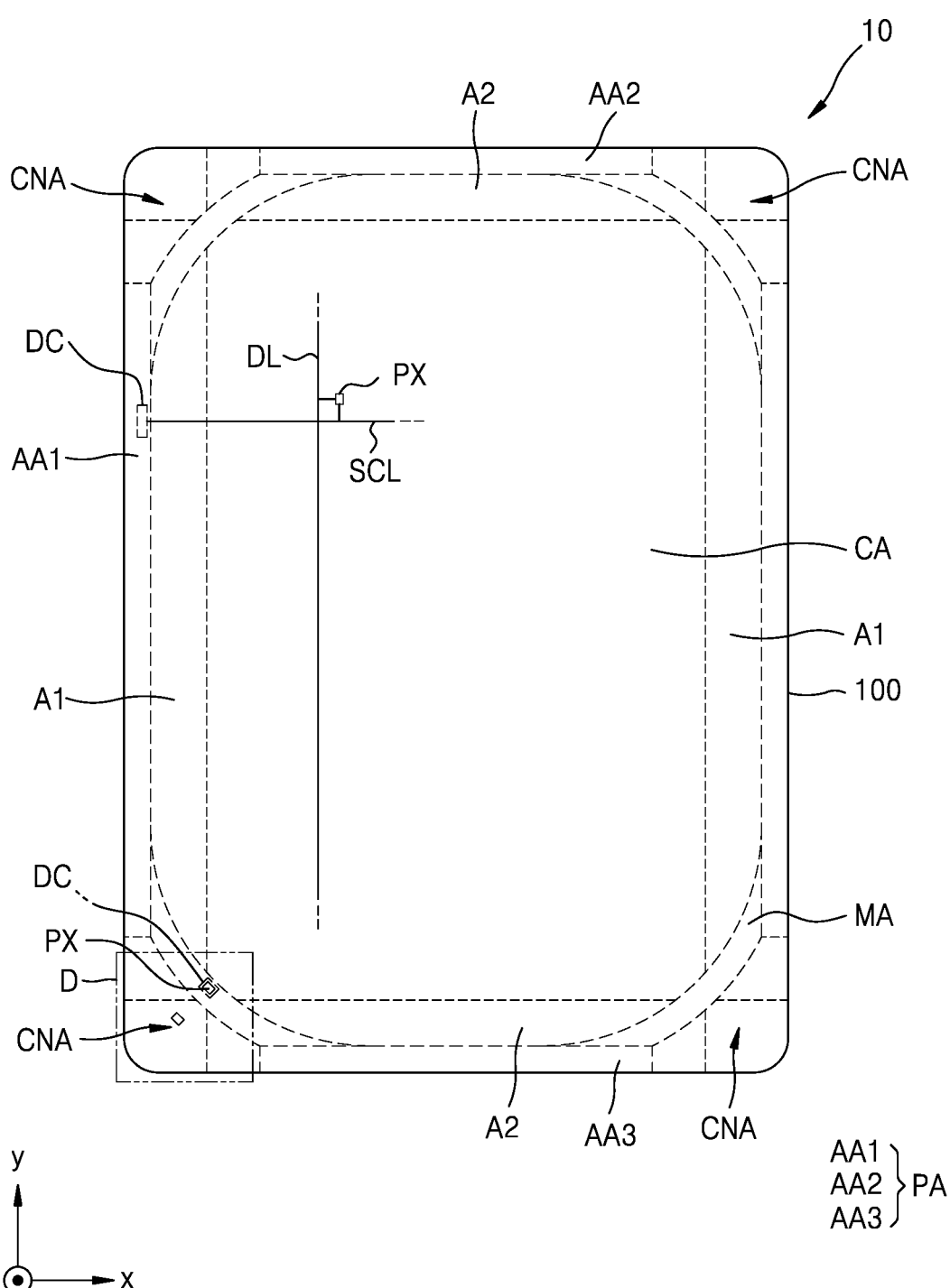
FIG. 3 is a plan view schematically illustrating a display panel, which is a portion of the display apparatus of FIG. 1A.

FIG. 3 is a plan view schematically illustrating the display panel 10, which is a portion of the display apparatus 1 of FIG. 1A. FIG. 3 schematically illustrates the display panel 10 in an unfolded state without being bent.

In an embodiment, as described above, the peripheral area PA may be outside the central area CA. The peripheral area PA may include a first adjacent area AA1, a second adjacent area AA2, and a third adjacent area AA3.

The first adjacent area AA1 may be positioned outside the first area A1. That is, the first area A1 may be between the first adjacent area AA1 and the central area CA. Accordingly, the first adjacent area AA1 may be positioned in the first direction from the first area A1, and may extend in the second direction, similarly to the first area A1. A driving circuit DC and/or a power supply line may be arranged in the first adjacent area AA1.

The second adjacent area AA2 and the third adjacent area AA3 may each be positioned outside the second area A2. That is, the second areas A2 may be between the second adjacent area AA2 and the central area CA and between the third adjacent area AA3 and the central area CA. The second adjacent area AA2 and the third adjacent area AA3 may each extend in the first direction, similarly to the second area A2. The second area A2 and the central area CA may be positioned between the second adjacent area AA2 and the third adjacent area AA3.

A bending area (not shown) may be positioned outside the third adjacent area AA3. That is, the third adjacent area AA3 may be positioned between the bending area and the second area A2. Also, a pad area (not shown) may be positioned outside the bending area. That is, the bending area may be positioned between the third adjacent area AA3 and the pad area. The display panel 10 may be bent in the bending area. In such an embodiment, the pad area may be positioned to overlap other portions of the display panel 10. Accordingly, the area of the peripheral area PA, which is visible to a user, may be minimized. A pad may be arranged in the pad area, and the display panel 10 may receive an electrical signal and/or a power voltage through the pad.

Although FIG. 3 illustrates the display panel 10 in an unfolded state without being bent, as described above, the display panel 10 may be bent at a portion thereof. That is, at least one of the first area A1, the second area A2, the corner area CNA, and the middle area MA may be bent.

In an embodiment, as described above, the first area A1 may be bent around an axis extending in the second direction, may be bent at a cross-section (e.g., the zx cross-section) in the first direction, and may not be bent at a cross-section (e.g., the yz cross-section) in the second direction. The second area A2 may be bent around an axis extending in the first direction, may be bent at a cross-section (e.g., the yz cross-section) in the second direction, and may not be bent at a cross-section (e.g., the zx cross-section) in the first direction. As at least a portion of the corner area CNA is bent at both of the cross-section (e.g., the zx cross-section) in the first direction and the cross-section (e.g., the yz cross-section) in the second direction, at least a portion of the corner area CNA may be a double curved area in which a plurality of curvatures in various directions overlap each other.

When the corner area CNA is bent as described above, a compressive strain greater than a tensile strain may occur in the corner area CNA. Accordingly, a structure, such as the substrate 100 which is contractible, is desired to be applied to at least a portion of the corner area CNA. As a result, the structure of the display panel 10 in the corner area CNA may be different from the structure of the display panel 10 in the central area CA.

As described above, the pixel PX which may be arranged in at least one selected from the central area CA, the first area A1, the second area A2, the corner area CNA, and the middle area MA may include a display element. The display element may be an organic light-emitting diode (OLED) including an organic emission layer. Alternatively, the display element may be a light-emitting diode (LED) including an inorganic emission layer. The size of an LED may be in a micro scale or a nano scale. For example, the LED may be a micro-LED. Alternatively, the LED may be a nanorod LED. The nanorod LED may include gallium nitride (GaN). In an embodiment, a color converting layer may be disposed on the display element. In such an embodiment, the color converting layer may include quantum dots. Alternatively, the display element may be a quantum dot LED including a quantum dot emission layer. Hereinafter, for convenience of description, embodiments in which the display element is an OLED will be described.

The pixel PX may include a plurality of sub-pixels, and each of the plurality of sub-pixels may emit light having a certain color by using a display element. A sub-pixel is the smallest unit that implements an image and refers to an emission area. In an embodiment where the display element is an OLED, an emission layer thereof may be defined by an opening of a pixel defining layer. This will be described below in greater detail.

The driving circuit DC may provide signals to the pixels PX. In an embodiment, for example, the driving circuit DC may be a scan driving circuit that provides scan signals to pixel circuits electrically connected to sub-pixels of the pixel PX through a scan line SCL. Alternatively, the driving circuit DC may be an emission-control driving circuit that provides emission control signals to pixel circuits electrically connected to sub-pixels through an emission control line (not shown). Alternatively, the driving circuit DC may be a data driving circuit that provides data signals to pixel circuits electrically connected to sub-pixels through a data line DL. Although not shown in FIG. 3, the data driving circuit may be arranged in the third adjacent area AA3 or the pad area. Alternatively, the data driving circuit may be disposed on a display circuit board connected to the display panel 10 through a pad.

Figure 4:
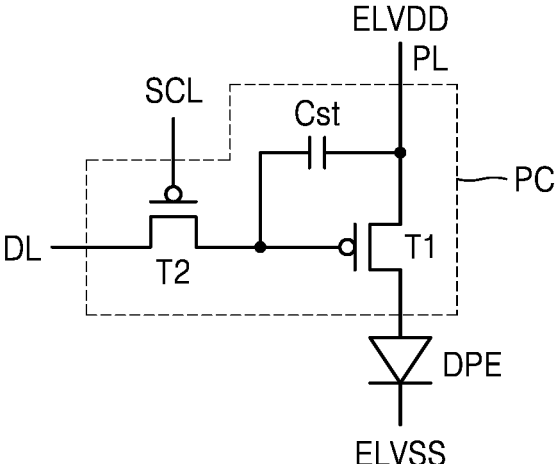
FIG. 4 is an equivalent circuit diagram illustrating an embodiment of a pixel circuit included in the display apparatus of FIG. 1A.

FIG. 4 is an equivalent circuit diagram illustrating an embodiment of a pixel circuit PC included in the display apparatus 1 of FIG. 1A. Particularly, FIG. 4 is an equivalent circuit diagram of the pixel circuit PC electrically connected to an OLED, which is a display element DPE forming a sub-pixel included in the display apparatus 1 of FIG. 1A. The pixel circuit PC electrically connected to one sub-pixel may include a driving thin-film transistor T1, a switching thin-film transistor T2, and a storage capacitor Cst. In an embodiment, the display element DPE may emit, for example, red, green, or blue light, or may emit red, green, blue, or white light.

The switching thin-film transistor T2 may be connected to the scan line SCL and a data line DL, and be configured to deliver, to the driving thin-film transistor T1, a data signal or a data voltage input to the data line DL, based on a scan signal or a switching voltage input to the scan line SCL.

The storage capacitor Cst may be connected to the switching thin-film transistor T2 and a driving voltage line PL, and store a voltage corresponding to a difference between a voltage received from the switching thin-film transistor T2 and a first power supply voltage ELVDD supplied to the driving voltage line PL.

The driving thin-film transistor T1 may be connected to the driving voltage line PL and the storage capacitor Cst, and may control a driving current flowing from the driving voltage line PL to the organic light-emitting diode OLED, which is a display element DPE, based on a voltage value stored in the storage capacitor Cst. The display element DPE may emit light having a certain brightness or luminance corresponding to the driving current. An opposite electrode of the display element DPE may receive a second power supply voltage ELVSS.

FIG. 4 illustrates an embodiment where the pixel circuit PC includes two thin-film transistors and a single storage capacitor, but not being limited thereto. In an embodiment, the pixel circuit PC may include at least two thin-film transistors.

Figure 5:
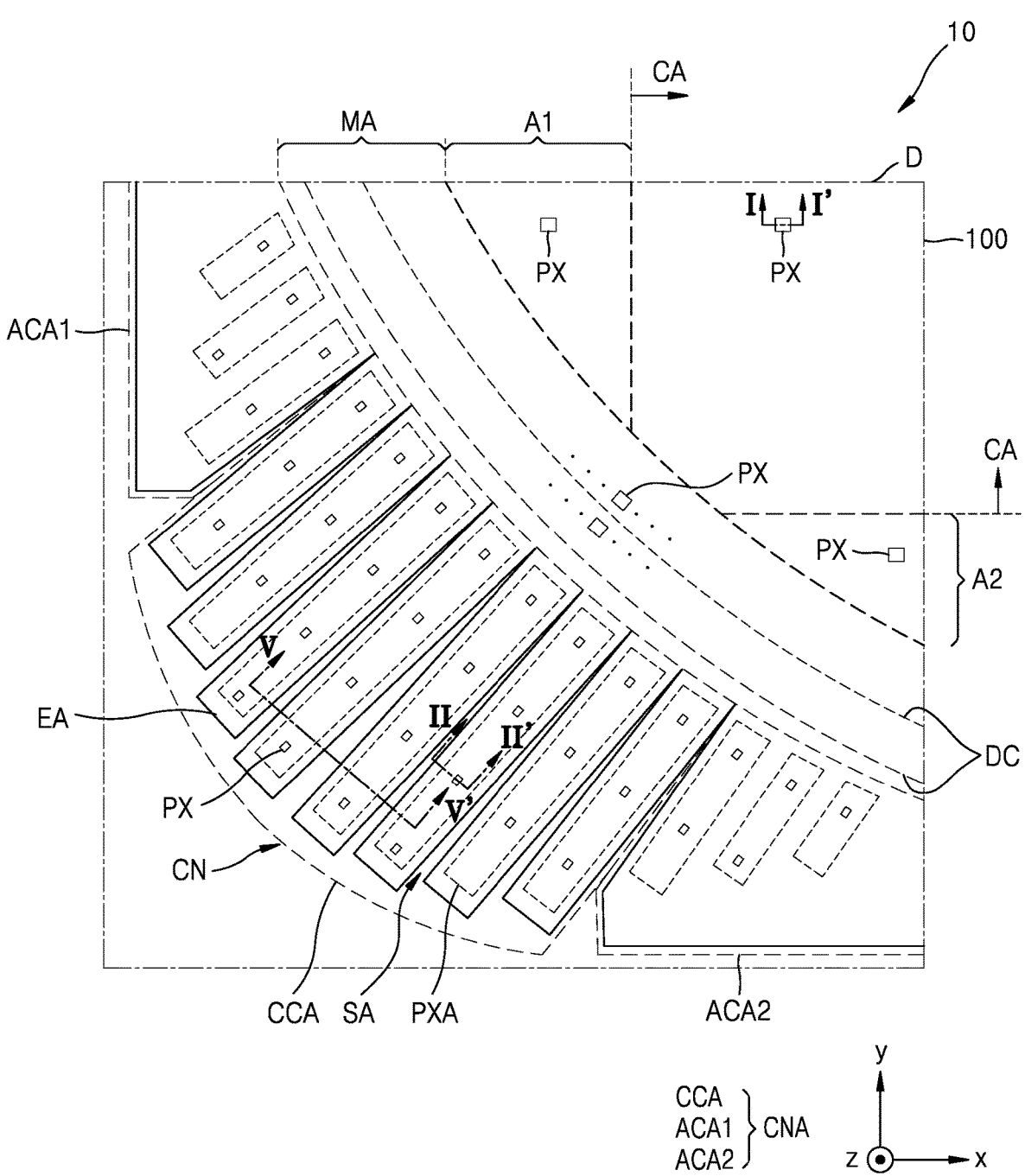
FIG. 5 is a conceptual diagram illustrating an enlarged region D of the display panel of FIG. 3.
Figure 6:
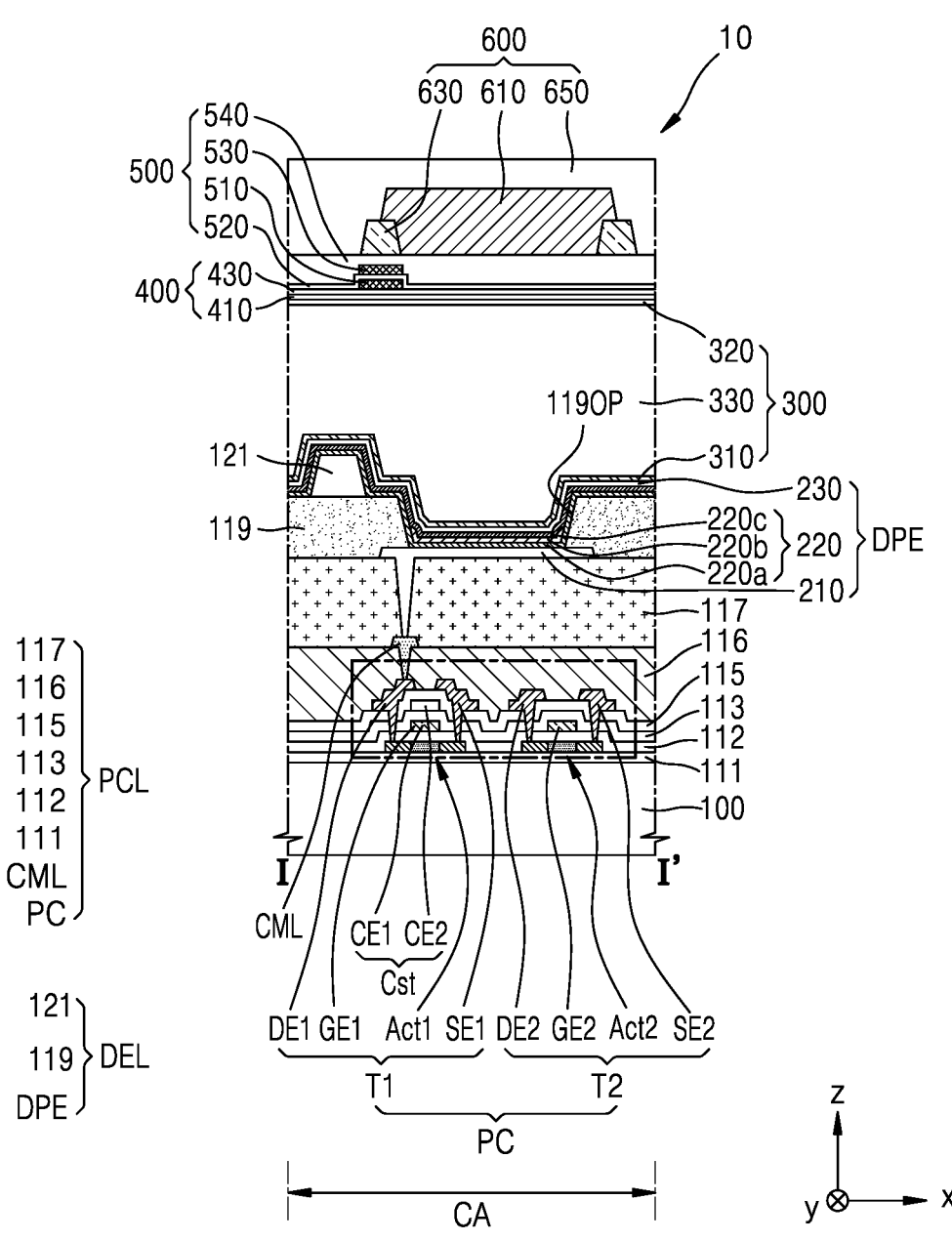
FIG. 6 is a cross-sectional view schematically illustrating the display panel, taken along line I-I' of FIG. 5.

FIG. 5 is a conceptual diagram illustrating an enlarged region D of the display panel 10 of FIG. 3, and FIG. 6 is a cross-sectional view illustrating the display panel 10, taken along line I-I' of FIG. 5.

As shown in FIGS. 5 and 6, in an embodiment, the display panel 10 of the display apparatus 1 may include a substrate 100, a pixel circuit layer PCL, a display element layer DEL, an encapsulation layer 300, a protective layer 400, a touch sensor layer 500, an anti-reflection layer 600, or the like.

The substrate 100 may include the central area CA, the first area A1, the second area A2, the corner area CNA, and the middle area MA. In such an embodiment, because the display panel 10 includes the substrate 100, the central area CA, the first area A1, the second area A2, the corner area CNA, the middle area MA, and the peripheral area PA may be defined on the substrate 100.

The first area A1 may be adjacent to the central area CA in the first direction (e.g., x direction or −x direction). The first area A1 may extend in the second direction (y direction or −y direction). The second area A2 may be adjacent to the central area CA in the second direction. The second area A2 may extend in the first direction.

The corner area CNA may be an area in which the corner CN is arranged. That is, the corner area CNA may be an area where an edge of the display panel 10 in the first direction meets an edge of the display panel 10 in the second direction. The corner area CNA may at least partially surround the central area CA, the first area A1, and the second area A2. Alternatively, the corner area CNA may at least partially surround the central area CA, the first area A1, the second area A2, and the middle area MA. The corner area CNA may include a central corner area CCA, a first adjacent corner area ACA1, and a second adjacent corner area ACA2.

The central corner area CCA may include an extension area EA. The extension area EA may extend in a direction away from the central area CA. The display panel 10 may include a plurality of extension areas EA. Each of the plurality of extension areas EA may extend in a direction away from the central area CA. In an embodiment, for example, the plurality of extension areas EA may each extend in a direction crossing the first direction (e.g., x direction or −x direction) and the second direction (y direction or −y direction).

A separation area SA may be defined between adjacent extension areas EA. The separation area SA may be an area in which components of the display panel 10 are not arranged. When the central corner area CCA is bent at the corner CN, a compressive strain greater than a tensile strain may occur in the central corner area CCA. In an embodiment, the separation area SA is defined between adjacent extension areas EA, and thus, the display panel 10 may be bent without being damaged in the central corner area CCA.

The first adjacent corner area ACA1 may be adjacent to the central corner area CCA. At least a portion of the first area A1 and the first adjacent corner area ACA1 may be positioned in the first direction (e.g., x direction or −x direction). An end of the first adjacent corner area ACA1 in a direction of the central corner area CCA and an end of the central corner area CCA in a direction of the first adjacent corner area ACA1 may be spaced apart from each other. The first adjacent corner area ACA1 may be bent at a cross-section (zx cross-section) in the first direction, and may not be bent at a cross-section (yz cross-section) in the second direction. The separation area SA may not be defined in the first adjacent corner area ACA1.

The second adjacent corner area ACA2 may be adjacent to the central corner area CCA. At least a portion of the second area A2 and the second adjacent corner area ACA2 may be positioned in the second direction (y direction or −y direction). An end of the second adjacent corner area ACA2 in a direction of the central corner area CCA and an end of the central corner area CCA in a direction of the second adjacent corner area ACA2 may be spaced apart from each other. The second adjacent corner area ACA2 may be bent at a cross-section (yz cross-section) in the second direction, and may not be bent at a cross-section (zx cross-section) in the first direction. The separation area SA may not be defined in the second adjacent corner area ACA2.

The middle area MA may be positioned between the central area CA and the corner area CNA. The middle area MA may extend between the central area CA and the first adjacent corner area ACA1. In addition, the middle area MA may extend between the central area CA and the second adjacent corner area ACA2. The middle area MA may at least partially surround the central area CA, the first area A1, and the second area A2.

As shown in FIG. 5, in an embodiment, the plurality of pixels PX may be arranged in the central area CA, the first area A1, the second area A2, the corner area CNA, and the middle area MA. Accordingly, the display panel 10 may display an image in the central area CA, the first area A1, the second area A2, the corner area CNA, and the middle area MA. Each of the plurality of extension areas EA may include a pixel area PXA, and the plurality of pixels PX may be arranged in the pixel area PXA. In each of the plurality of extension areas EA, the plurality of pixels PX may be arranged in an extension direction of the extension area EA. The pixel PX may include the display element DPE.

The driving circuit DC for providing an electrical signal to the pixel PX or a power supply line for providing power to the pixel PX may be arranged in the middle area MA. A plurality of driving circuits DC may be provided. The driving circuit DC may extend in a direction in which the middle area MA extends. The driving circuit DC may at least partially surround the central area CA, the first area A1, and the second area A2.

In an embodiment, the pixel PX arranged in the middle area MA may overlap the driving circuit DC and/or a power supply line. In such an embodiment, the middle area MA may function as a display area even when the driving circuit DC and/or the power supply line are arranged. However, the disclosure is not limited thereto. In an alternative embodiment, for example, the driving circuit DC and/or a power supply line may not be arranged in the middle area MA. In such an embodiment, the pixel PX in the middle area MA may not overlap the driving circuit DC and/or the power supply line.

The substrate 100 may include a polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, or the like. Alternatively, the substrate 100 may include two layers each including the polymer resin, and a barrier layer between the two layers. In such an embodiment, the barrier layer may include an inorganic material such as silicon oxide ($SiO_X$), silicon nitride ($SiN_X$), and/or silicon oxynitride ($SiO_XN_Y$), or the like. Alternatively, the substrate 100 may include glass or a metal.

The pixel circuit layer PCL may be disposed on the substrate 100. The pixel circuit layer PCL may include the pixel circuit PC, a buffer layer 111, a first gate insulating layer 112, a second gate insulating layer 113, an interlayer insulating layer 115, a first planarization layer 116, a second planarization layer 117, and a connection electrode CML. The pixel circuit PC may include at least one thin-film transistor. In an embodiment, the pixel circuit PC may include a driving thin-film transistor T1, a switching thin-film transistor T2, and a storage capacitor Cst.

The driving thin-film transistor T1 may include a first semiconductor layer Act1, a first gate electrode GE1, a first source electrode SE1, and a first drain electrode DE1. The pixel circuit layer PCL may further include the buffer layer 111, the first gate insulating layer 112, the second gate insulating layer 113, the interlayer insulating layer 115, the first planarization layer 116, and the second planarization layer 117, which are disposed above and/or below the components of the driving thin-film transistor T1.

The buffer layer 111 may reduce or block penetration of foreign substances, moisture, or external air from a lower portion of the substrate 100 and may provide a flat surface on the substrate 100. The buffer layer 111 may include an inorganic material such as an oxide or a nitride, an organic material, or a composite of an organic material and an inorganic material, and may have a single-layered structure or a multi-layered structure, each including an inorganic material and an organic material.

The first semiconductor layer Act1 may be disposed on the buffer layer 111. The first semiconductor layer Act1 may include polysilicon. Alternatively, the first semiconductor layer Act1 may include an amorphous silicon, an oxide semiconductor, an organic semiconductor, or the like. The first semiconductor layer Act1 may include a channel area, a drain area, and a source area, wherein the drain area and the source area are arranged on both sides of the channel area.

The first gate electrode GE1 may overlap the channel area. The first gate electrode GE1 may include a low-resistance metal material. The first gate electrode GE1 may include a conductive material including molybdenum (Mo), aluminum (Al), copper (Cu), titanium (Ti), or the like, and may be a multi-layer or a single layer, each including at least one selected from the conductive materials.

The first gate insulating layer 112 may be between the first semiconductor layer Act1 and the first gate electrode GE1. The first gate insulating layer 112 may include silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide (ZnO or $ZnO_2$), or the like.

The second gate insulating layer 113 may cover the first gate electrode GE1. The second gate insulating layer 113 may include silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide (ZnO or $ZnO_2$), or the like.

A second capacitor electrode CE2 of the storage capacitor Cst may be disposed on the second gate insulating layer 113. The second capacitor electrode CE2 may overlap the first gate electrode GE1 therebelow. In such an embodiment, the first gate electrode GE1 of the driving thin-film transistor T1 and the second capacitor electrode CE2, which overlap each other with the second gate insulating layer 113 therebetween, may form the storage capacitor Cst. That is, the first gate electrode GE1 of the driving thin-film transistor T1 may function as a first capacitor electrode CE1 of the storage capacitor Cst, and the storage capacitor Cst may overlap the driving thin-film transistor T1. However, the disclosure is not limited thereto. In an alternative embodiment, for example, the storage capacitor Cst may not overlap the driving thin-film transistor T1. The second capacitor electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or a multi-layer, each including at least one selected from the materials stated above.

The interlayer insulating layer 115 may cover the second capacitor electrode CE2. The interlayer insulating layer 115 may include silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide (ZnO or $ZnO_2$), or the like.

Each of the first drain electrode DE1 and the first source electrode SE1 may be disposed on the interlayer insulating layer 115. The first drain electrode DE1 and the first source electrode SE1 may each include a material having high conductivity. The first drain electrode DE1 and the first source electrode SE1 may each include a conductive material including Mo, Al, Cu, Ti, or the like, and may be a multi-layer or a single layer, each including at least one selected from the above materials. In an embodiment, for example, the first drain electrode DE1 and the first source electrode SE1 may each have a multi-layered structure of Ti/Al/Ti.

The switching thin-film transistor T2 may include a second semiconductor layer Act2, a second gate electrode GE2, a second drain electrode DE2, and a second source electrode SE2. The second semiconductor layer Act2, the second gate electrode GE2, the second drain electrode DE2, and the second source electrode SE2 may be respectively similar to the first semiconductor layer Act1, the first gate electrode GE1, the first drain electrode DE1, and the first source electrode SE1, and thus, any repetitive detailed descriptions thereof will be omitted.

The pixel circuit layer PCL may further include the driving circuit DC, and the driving circuit DC may be arranged in the middle area MA. The driving circuit DC may include at least one thin-film transistor, and the driving circuit DC may be connected to a scan line. Similarly to the switching thin-film transistor T2, the thin-film transistor of the driving circuit DC may include a driving circuit semiconductor layer, a driving circuit gate electrode, a driving circuit source electrode, and a driving circuit drain electrode.

The first planarization layer 116 may cover the first drain electrode DE1 and the first source electrode SE1. The first planarization layer 116 may have an approximately flat upper surface. The first planarization layer 116 may include an organic material. In an embodiment, for example, the first planarization layer 116 may include benzocyclobutene (BCB), polyimide, hexamethyldisiloxane (HDMSO), a general commercial polymer such as poly(methyl methacrylate) (PMMA) or polystyrene (PS), a polymer derivative having a phenol group, an acrylic polymer, an imide polymer, an aryl ether polymer, an amide polymer, a fluorine polymer, a p-xylene polymer, a vinyl alcohol polymer, or a mixture thereof. In an embodiment, the first planarization layer 116 may include an inorganic material. In such an embodiment, the first planarization layer 116 may include silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide (ZnO or $ZnO_2$), or the like. In an embodiment where the first planarization layer 116 includes an inorganic material, chemical polishing planarization may be selectively performed on the first planarization layer 116. In an embodiment, the first planarization layer 116 may include both an organic material and an inorganic material.

The pixel circuit layer PCL may further include the connection electrode CML, and the connection electrode CML may be disposed on the first planarization layer 116. In such an embodiment, the connection electrode CML may be connected to the first drain electrode DE1 or the first source electrode SE1 through a contact hole defined through the first planarization layer 116. The connection electrode CML may include a material having high conductivity. The connection electrode CML may include a conductive material including Mo, Al, Cu, Ti, or the like, and may be a multi-layer or a single layer, each including at least one selected from the above materials. In an embodiment, for example, the connection electrode CML may have a multi-layered structure of Ti/Al/Ti.

The second planarization layer 117 may cover the connection electrode CML. The second planarization layer 117 may have an approximately flat upper surface. The second planarization layer 117 may include an organic material. In an embodiment, for example, the second planarization layer 117 include BCB, polyimide, HDMSO, a general commercial polymer such as PMMA or PS, a polymer derivative having a phenol group, an acrylic polymer, an imide polymer, an aryl ether polymer, an amide polymer, a fluorine polymer, a p-xylene polymer, a vinyl alcohol polymer, or a mixture thereof. In an embodiment, the second planarization layer 117 may include an inorganic material. In such an embodiment, the second planarization layer 117 may include silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide (ZnO or $ZnO_2$), or the like. In an embodiment where the second planarization layer 117 includes an inorganic material, chemical polishing planarization may be selectively performed on the second planarization layer 117. In an embodiment, the second planarization layer 117 may include both an organic material, and an inorganic material.

The display element layer DEL may be disposed on the pixel circuit layer PCL. The display element layer DEL may include the display element DPE, a pixel defining layer 119, and a spacer 121. In an embodiment, the display element DPE may be an OLED, and the OLED may include a pixel electrode 210, an opposite electrode 230, and an intermediate layer 220 positioned therebetween and including an emission layer.

The pixel electrode 210 may be disposed on the second planarization layer 117 having a flat upper surface. The pixel electrode 210 may be electrically connected to the connection electrode CML through a contact hole defined or formed in the second planarization layer 117. Also, as shown in FIG. 6, the OLED, which is the display element DPE, may overlap the pixel circuit PC in the central area CA, where the pixel circuit PC is electrically connected to the display element DPE.

The pixel electrode 210 may include a (semi-)transparent electrode or a reflective electrode. In some embodiments, the pixel electrode 210 may include a reflective layer including Ag, Mg, Al, Pt, Pd, Au, Ni, Nd, Ir, Cr, or a compound thereof, and a transparent or semi-transparent electrode layer disposed on the reflective layer. The transparent or semi-transparent electrode layer may include at least one selected from indium tin oxide (ITO), indium zinc oxide (IZO), zinc oxide (ZnO or $ZnO_2$), indium oxide ($In_2O_3$), indium gallium oxide (IGO), and aluminum zinc oxide (AZO). In some embodiments, the pixel electrode 210 may have a stacked structure of ITO/Ag/ITO.

The pixel defining layer 119 may be disposed on the second planarization layer 117, and the pixel defining layer 119 may define an emission area of a pixel by an opening 1190P defined therethrough to expose a central portion of the pixel electrode 210. In addition, the pixel defining layer 119 may prevent an arc or the like from being generated at an edge of the pixel electrode 210 by increasing a distance between the edge of the pixel electrode 210 and the opposite electrode 230 disposed above the pixel electrode 210. The pixel defining layer 119 may include or be formed of an organic insulating material, such as polyimide, polyamide, acrylic resin, BCB, HMDSO, and phenol resin, in a spin coating method or the like.

The intermediate layer 220 may be disposed on the pixel defining layer 119. The intermediate layer 220 may include an emission layer 220b arranged in the opening 1190P of the pixel defining layer 119 and overlapping the pixel electrode 210. The intermediate layer 220 may further include a first functional layer 220a between the pixel electrode 210 and the emission layer 220b, and a second functional layer 220c disposed on the emission layer 220b. The first functional layer 220a may include, for example, a hole transport layer (HTL), or an HTL and a hole injection layer (HIL). The second functional layer 220c may include an electron transport layer (ETL) and/or an electron injection layer (EIL). The first functional layer 220a and/or the second functional layer 220c may be integrally formed to correspond to a plurality of pixel electrodes 210.

The opposite electrode 230 may be a transparent electrode or a reflective electrode. In some embodiments, the opposite electrode 230 may be a transparent or semi-transparent electrode, and may include a thin metal film having a small work function and including lithium (Li), Ca, lithium fluoride (LiF)/Ca, LiF/Al, Al, Ag, Mg, and a compound thereof. In addition, the opposite electrode 230 may further include a transparent conductive oxide (TCO) film, such as ITO, IZO, ZnO, $ZnO_2$, $In_2O_3$, or the like. The opposite electrodes 230 may be integrally formed to correspond to the plurality of pixel electrodes 210.

The spacer 121 may be disposed on the pixel defining layer 119. The spacer 121 may prevent damage to the substrate 100 or a multi-layered film disposed on the substrate 100 in a method of manufacturing a display apparatus. In an embodiment of a method of manufacturing a display panel, a mask sheet may be used. In such an embodiment, the mask sheet may enter the opening 1190P of the pixel defining layer 119 or may be in close contact with the pixel defining layer 119. The spacer 121 may prevent or reduce a defect in which the substrate 100 and a portion of the multi-layered film are damaged by the mask sheet when a deposition material is deposited on the substrate 100.

The spacer 121 may include an organic material such as polyimide. Alternatively, the spacer 121 may include an inorganic insulating material, such as silicon oxide ($SiO_X$) or silicon nitride ($SiN_X$), or may include an organic insulating material and an inorganic insulating material. In an embodiment, the spacer 121 may include a material different from that of the pixel defining layer 119. Alternatively, the spacer 121 may include a same material as that of the pixel defining layer 119. In such an embodiment, the pixel defining layer 119 and the spacer 121 may be formed together in a mask operation using a halftone mask or the like.

The encapsulation layer 300 may be disposed on the opposite electrode 230, where the encapsulation layer 300 includes a first inorganic encapsulation layer 310, a second inorganic encapsulation layer 320, and an organic encapsulation layer 330 therebetween.

The first inorganic encapsulation layer 310 and the second inorganic encapsulation layer 320 may each include silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide (ZnO or $ZnO_2$), or the like. The organic encapsulation layer 330 may include polyethylene terephthalate, polyethylene napthalate, polycarbonate, polyimide, polyethylene sulfonate, polyoxymethylene, polyarylate, HMDSO, an acrylic resin (for example, polymethyl methacrylate, polyacrylic acid, or the like), or any combination thereof.

The protective layer 400 may be disposed on the encapsulation layer 300. The protective layer 400 may protect the encapsulation layer 300. In an embodiment, for example, the protective layer 400 may prevent or reduce an arc from being generated in the first inorganic encapsulation layer 310 and/or the second inorganic encapsulation layer 320. A second inorganic protective layer 430 of the protective layer 400 may be disposed on a first inorganic protective layer 410 of the protective layer 400.

The first inorganic protective layer 410 and the second inorganic protective layer 430 may each include silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), zinc oxide (ZnO or $ZnO_2$), or the like.

The touch sensor layer 500 may be disposed on the protective layer 400. The touch sensor layer 500 may obtain coordinate information according to an external input, for example, a touch event. The touch sensor layer 500 may include a first touch conductive layer 510, a first touch insulating layer 520, a second touch conductive layer 530, and a second touch insulating layer 540.

The first touch conductive layer 510 may be disposed on the second inorganic protective layer 430. The first touch conductive layer 510 may include a conductive material. In an embodiment, the first touch conductive layer 510 may include at least one selected from Mo, Al, Cu, and Ti. In an embodiment, for example, the first touch conductive layer 510 may have a multi-layered structure of Ti/Al/Ti, in which a titanium layer, an aluminum layer, and a titanium layer are sequentially stacked.

The first touch insulating layer 520 may be disposed on the first touch conductive layer 510. The first touch insulating layer 520 may include an inorganic material. In an embodiment, for example, the first touch insulating layer 520 may include at least one inorganic material selected from aluminum oxide ($Al_2O_3$), titanium oxide ($TiO_2$), tantalum oxide ($Ta_2O_5$), hafnium oxide ($HfO_2$), zinc oxide (ZnO), silicon nitride ($SiN_x$), and silicon oxynitride ($SiO_xN_y$).

The second touch conductive layer 530 may be disposed on the first touch insulating layer 520. In an embodiment, a contact hole may be defined through the first touch insulating layer 520, and the second touch conductive layer 530 may be connected to the first touch conductive layer 510 through the contact hole. The second touch conductive layer 530 may include a conductive material. In an embodiment, the second touch conductive layer 530 may include at least one selected from Mo, Al, Cu, and Ti. In an embodiment, for example, the second touch conductive layer 530 may have a multi-layered structure of Ti/Al/Ti, in which a titanium layer, an aluminum layer, and a titanium layer are sequentially stacked.

The second touch insulating layer 540 may be disposed on the second touch conductive layer 530. An upper surface of the second touch insulating layer 540 may be flat. The second touch insulating layer 540 may include an organic material. In an embodiment, the second touch insulating layer 540 may include a polymer-based material. The polymer-based material stated above may be transparent. In an embodiment, for example, the second touch insulating layer 540 may include a silicone resin, an acrylic resin, an epoxy resin, polyimide, polyethylene, or the like. In an embodiment, the second touch insulating layer 540 may include an inorganic material.

The anti-reflection layer 600 may be disposed on the touch sensor layer 500. The anti-reflection layer 600 may reduce the reflectance of light incident from the outside toward the display panel 10. The anti-reflection layer 600 may increase the color purity of light emitted from the display panel 10. The anti-reflection layer 600 may include a color filter 610, a black matrix 630, and a planarization layer 650. The color filter 610 may overlap an OLED, which is the display element DPE. The color filter 610 may be arranged by considering the color of light emitted from the OLED. In an embodiment, the color filter 610 may include red, green, or blue pigments or dyes. Alternatively, the color filter 610 may further include quantum dots in addition to the pigments or dyes stated above. Alternatively, the color filter 610 may not include the pigments or dyes stated above, and may include scattering particles such as titanium oxide.

The black matrix 630 may be adjacent to the color filter 610 and overlap at least one of the first touch conductive layer 510 and/or the second touch conductive layer 530. The black matrix 630 may at least partially absorb external light or internally-reflected light. The black matrix 630 may include a black pigment.

The planarization layer 650 may be disposed on the color filter 610 and the black matrix 630. An upper surface of the planarization layer 650 may be flat. The planarization layer 650 may include an organic material. In an embodiment, the planarization layer 650 may include a transparent polymer-based material. In an embodiment, for example, the planarization layer 650 may include a silicone resin, an acrylic resin, an epoxy resin, polyimide, polyethylene, or the like.

The pixel PX in the central area CA has been described with reference to FIG. 6. Hereinafter, the structure of a portion near the separation area SA in the extension area EA and the pixel PX in the extension area EA will be described with reference to FIG. 7, which is a cross-section view schematically illustrating the display panel 10, taken along line II-II' of FIG. 5. The same or like elements shown in FIG. 7 have been labeled with the same reference characters as used above to describe those shown in FIG. 6, and any repetitive detailed description thereof will hereinafter be omitted or simplified.

Figure 7:
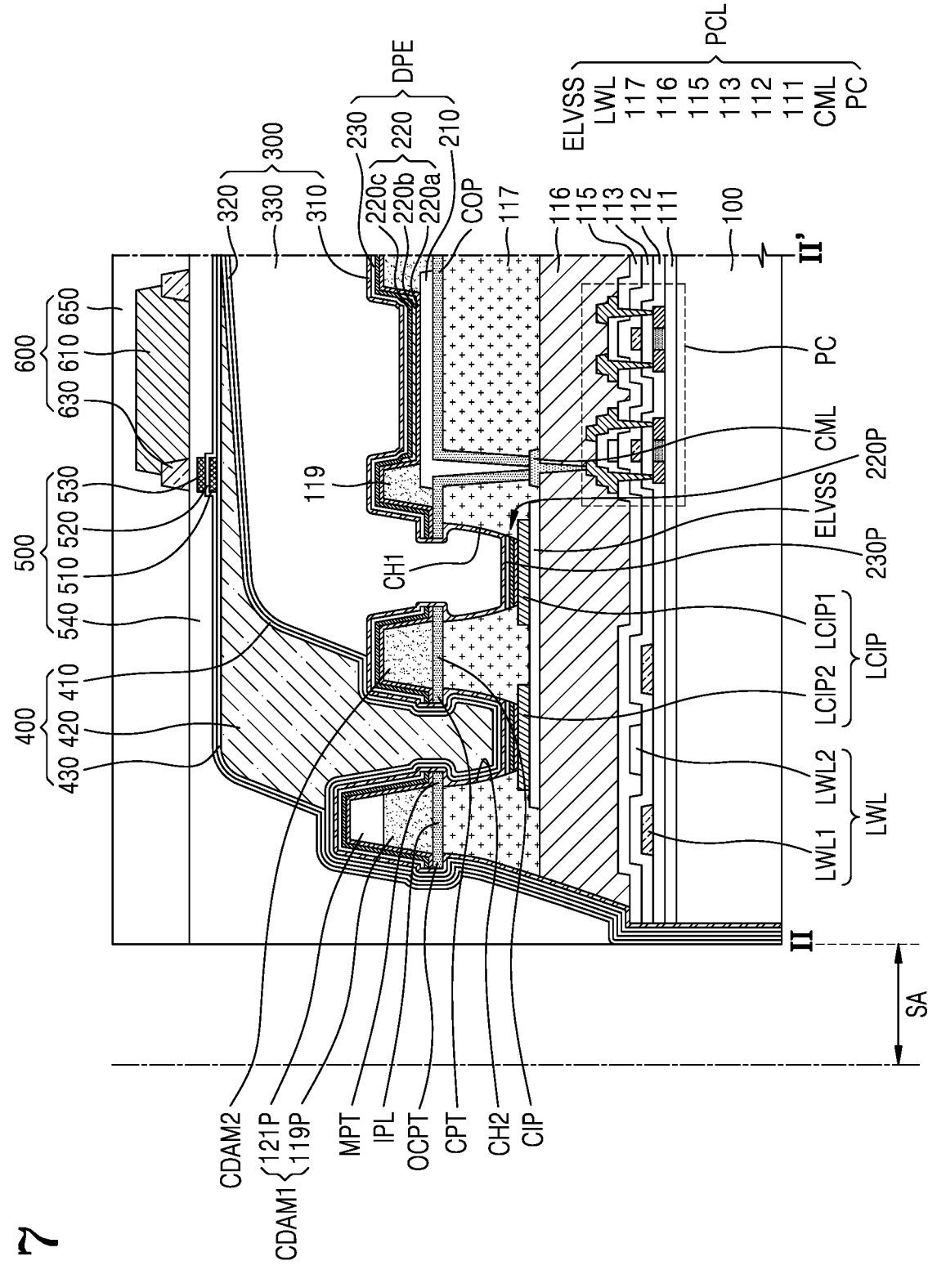
FIG. 7 is a cross-sectional view schematically illustrating the display panel, taken along line II-II' of FIG. 5.

As shown in FIG. 7, the pixel circuit layer PCL may include the pixel circuit PC, the buffer layer 111, the first gate insulating layer 112, the second gate insulating layer 113, the interlayer insulating layer 115, the first planarization layer 116, the second planarization layer 117, and the connection electrode CML. The pixel circuit layer PCL may further include a lower line LWL and an electrode power supply line ELVSS.

The lower line LWL may transmit a power voltage and/or an electrical signal to a pixel in the corner area CNA. The lower line LWL may include a first lower line LWL1 and a second lower line LWL2. The first lower line LWL1 may be between the first gate insulating layer 112 and the second gate insulating layer 113, and the second lower line LWL2 may be between the second gate insulating layer 113 and the interlayer insulating layer 115.

Similarly to the connection electrode CML, the electrode power supply line ELVSS may be disposed on the first planarization layer 116, and may be simultaneously formed with the connection electrode CML using a same material as that of the connection electrode CML. The electrode power supply line ELVSS may be electrically connected to the opposite electrode 230 of the OLED, which is the display element DPE, to apply an electrically signal to the opposite electrode 230.

The second planarization layer 117 may cover the electrode power supply line ELVSS and the connection electrode CML. As shown in FIG. 7, the second planarization layer 117 may have a first corner hole CH1 and a second corner hole CH2. In an embodiment, a contact hole is defined in the second planarization layer 117, such that the pixel electrode 210 positioned on the second planarization layer 117 may be connected to the connection electrode CML through the contact hole. The first corner hole CH1, the second corner hole CH2, and the contact hole of the second planarization layer 117 may be simultaneously formed.

The first corner hole CH1 and the second corner hole CH2 may overlap the electrode power supply line ELVSS, and a lower corner inorganic pattern LCIP on the electrode power supply line ELVSS may prevent or minimize damage to the electrode power supply line ELVSS in an operation of forming the first corner hole CH1 and the second corner hole CH2. In an embodiment, the lower corner inorganic pattern LCIP includes a first lower corner inorganic pattern LCIP1 and a second lower corner inorganic pattern LCIP2, where the first lower corner inorganic pattern LCIP1 may overlap the first corner hole CH1, and the second lower corner inorganic pattern LCIP2 may overlap the second corner hole CH2. Accordingly, in an operation of forming the first corner hole CH1 and the second corner hole CH2, the electrode power supply line ELVSS may not be exposed or the degree of exposure thereof may be minimized to prevent or minimize damage to the electrode power supply line ELVSS. The lower corner inorganic pattern LCIP may include silicon oxide ($SiO_x$), silicon nitride ($SiN_x$), silicon oxynitride (Si- $O_xN_y$), aluminum oxide ($Al_2O_3$), titanium oxide ($TiO_2$), tantalum oxide ($Ta_2O_5$), hafnium oxide ($HfO_2$), zinc oxide ($ZnO$ or $ZnO_2$), or the like.

An overlapping inorganic pattern COP, a corner inorganic pattern CIP, and an inorganic pattern line IPL may be positioned on the second planarization layer 117. The overlapping inorganic pattern COP, the corner inorganic pattern CIP, and the inorganic pattern line IPL may be simultaneously formed with each other using a same material. The overlapping inorganic pattern COP, the corner inorganic pattern CIP, and the inorganic pattern line IPL may each include silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), zinc oxide ($ZnO$ or $ZnO_2$), or the like.

The overlapping inorganic pattern COP is on the second planarization layer 117, but may be positioned near the contact hole of the second planarization layer 117. As shown in FIG. 7, the overlapping inorganic pattern COP may also be on the inner surface of the contact hole of the second planarization layer 117. In such an embodiment, the pixel electrode 210 on the second planarization layer 117 may be on the overlapping inorganic pattern COP and connected to the connection electrode CML through the contact hole of the second planarization layer 117.

The corner inorganic pattern CIP is spaced apart from the overlapping inorganic pattern COP by the first corner hole CH1, and may have a shape that at least partially surrounds the overlapping inorganic pattern COP in a plan view. The inorganic pattern line IPL is spaced apart from the corner inorganic pattern CIP by the second corner hole CH2, and may have a shape that at least partially surrounds the corner inorganic pattern CIP in a plan view.

The corner inorganic pattern CIP may have a corner protruding tip CPT protruding toward a center of at least one of the first corner hole CH1 and the second corner hole CH2. FIG. 7 illustrates an embodiment where the corner inorganic pattern CIP protrudes toward the center of each of the first corner hole CH1 and the second corner hole CH2. The inorganic pattern line IPL may have a middle protruding tip MPT protruding toward the center of the second corner hole CH2. In addition, the inorganic pattern line IPL may have an outer corner protruding tip OCPT protruding in a direction of the separation area SA. As shown in FIG. 7, the overlapping inorganic pattern COP may also have a protruding tip protruding toward the center of the first corner hole CH1.

The pixel defining layer 119 may cover an edge of the pixel electrode 210. In such an embodiment, when the pixel defining layer 119 is formed, a first pattern 119P may be simultaneously formed with the pixel defining layer 119 using a same material as that of the pixel defining layer 119. The first pattern 119P may be on the inorganic pattern line IPL. The first pattern 119P may form a first corner dam CDAM1 together with the inorganic pattern line IPL. When the spacer 121 is formed on the pixel defining layer 119, a second pattern 121P on the first pattern 119P may be simultaneously formed with the spacer 121 using a same material as that of the spacer 121. In such an embodiment, the first pattern 119P and the second pattern 121P may form the first corner dam CDAM1 together with the inorganic pattern line IPL. In addition, when the pixel defining layer 119 is formed, a second corner dam CDAM2 spaced apart from the first corner dam CDAM1 and positioned on the corner inorganic pattern CIP may be simultaneously formed with the pixel defining layer 119 using a same material as that of the pixel defining layer 119.

Similar to the central area CA described above with respect to FIG. 6, the intermediate layer 220 may be disposed on the pixel defining layer 119 in the extension area EA. The intermediate layer 220 may include the emission layer 220b arranged in the opening 1190P of the pixel defining layer 119 and overlapping the pixel electrode 210. The intermediate layer 220 may further include the first functional layer 220a between the pixel electrode 210 and the emission layer 220b, and the second functional layer 220c disposed on the emission layer 220b.

As described above, the overlapping inorganic pattern COP may have a protruding tip protruding toward the center of the first corner hole CH1. Also, the corner inorganic pattern CIP may have a corner protruding tip CPT protruding toward the center of the first corner hole CH1. Accordingly, when the first functional layer 220a and the second functional layer 220c are formed, a function layer pattern 220P spaced apart from the first functional layer 220a and the second functional layer 220c and positioned in the first corner hole CH1 may be formed by the protruding tip of the overlapping inorganic pattern COP and the corner protruding tip CPT of the corner inorganic pattern CIP. In addition, as described above, the inorganic pattern line IPL has the middle protruding tip MPT protruding toward the center of the second corner hole CH2. Accordingly, when the first functional layer 220a and the second functional layer 220c are formed, the function layer pattern 220P in the second corner hole CH2 may be formed by the corner protruding tip CPT and the middle protruding tip MPT.

The opposite electrode 230 is formed on the pixel defining layer 119 and the intermediate layer 220 to correspond to the plurality of pixel electrodes 210. Accordingly, a common electrode pattern 230P may be formed in the first corner hole CH1 and the second corner hole CH2 as similar to the function layer pattern 220P formed in the first corner hole CH1 and the second corner hole CH2.

The first inorganic encapsulation layer 310 of the encapsulation layer 300 may be on the opposite electrode 230, and may be in direct contact with the protruding tip of the overlapping inorganic pattern COP, the corner protruding tip CPT of the corner inorganic pattern CIP, and the middle protruding tip MPT of the inorganic pattern line IPL. In addition, in some cases, as shown in FIG. 7, the first inorganic encapsulation layer 310 may be in contact with the common electrode pattern 230P in the first corner hole CH1 and the second corner hole CH2, and may also cover an inner side surface of each of the first corner hole CH1 and the second corner hole CH2. The organic encapsulation layer 330 of the encapsulation layer 300 is on the first inorganic encapsulation layer 310, and may fill the first corner hole CH1 as shown in FIG. 7. The second corner dam CDAM2 may prevent a material for forming the organic encapsulation layer 330 from flowing out during a manufacturing operation. The second inorganic encapsulation layer 320 of the encapsulation layer 300 may be on the organic encapsulation layer 330. The second inorganic encapsulation layer 320 may be in direct contact with the first inorganic encapsulation layer 310 on the second corner dam CDAM2. In an embodiment, the second inorganic encapsulation layer 320 may be in direct contact with the first inorganic encapsulation layer 310 in the second corner hole CH2.

The protective layer 400 may include the first inorganic protective layer 410, an organic protective layer 420, and the second inorganic protective layer 430. The first inorganic protective layer 410 may be on the encapsulation layer 300, and the organic protective layer 420 may be on the first inorganic protective layer 410. Also, the second inorganic protective layer 430 may be on the organic protective layer 420. The organic protective layer 420 may fill the second corner hole CH2. The second inorganic protective layer 430 may be in direct contact with the first inorganic protective layer 410 on the first corner dam CDAM1. The first inorganic protective layer 410 and the second inorganic protective layer 430 may surround the corner protruding tip CPT of the corner inorganic pattern CIP. Also, the first inorganic protective layer 410 and the second inorganic protective layer 430 may surround the outer corner protruding tip OCPT of the inorganic pattern line IPL. Accordingly, a display apparatus may be effectively prevented from being damaged by oxygen or moisture from the outside, and the mechanical strength of the display apparatus may be increased to prevent the display apparatus from being damaged by an external shock.

The touch sensor layer 500 may be on the protective layer 400. The touch sensor layer 500 may include the first touch conductive layer 510, the first touch insulating layer 520, the second touch conductive layer 530, and the second touch insulating layer 540. In an embodiment, the second touch insulating layer 540 may overlap the outer corner protruding tip OCPT of the inorganic pattern line IPL.

As in the central area CA described above with reference to FIG. 6, the anti-reflection layer 600 may also be disposed on the touch sensor layer 500 in the extension area EA. The anti-reflection layer 600 may include, for example, the color filter 610, the black matrix 630, and the planarization layer 650. The color filter 610 may overlap the pixel electrode 210.

FIGS. 8A to 8C, 9, 10A, 10B, 11, 12A, 12B, and 13A to 13C are diagrams for describing a method of manufacturing a display apparatus according to an embodiment. For convenience of description, FIGS. 8A to 8C, and 9 illustrate an operation of preparing a display panel based on a cross-section of the display panel 10 taken along line V-V of FIG. 5.

Figure 8A:
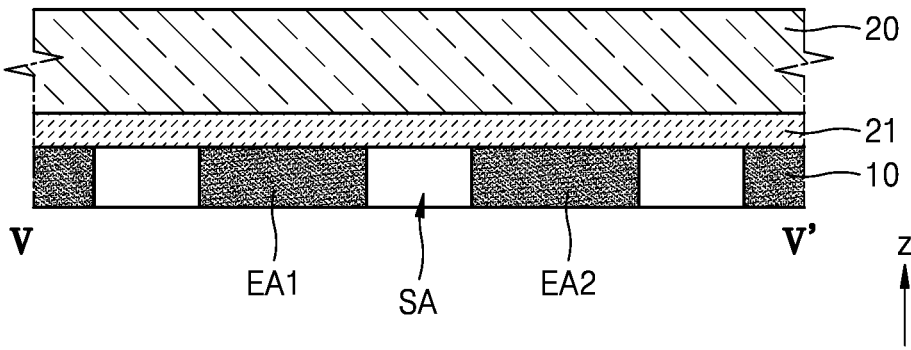
FIGS. 8A to 8C are cross-sectional views for describing an operation of preparing a display panel from among operations of a method of manufacturing a display apparatus according to an embodiment.
Figure 8B:
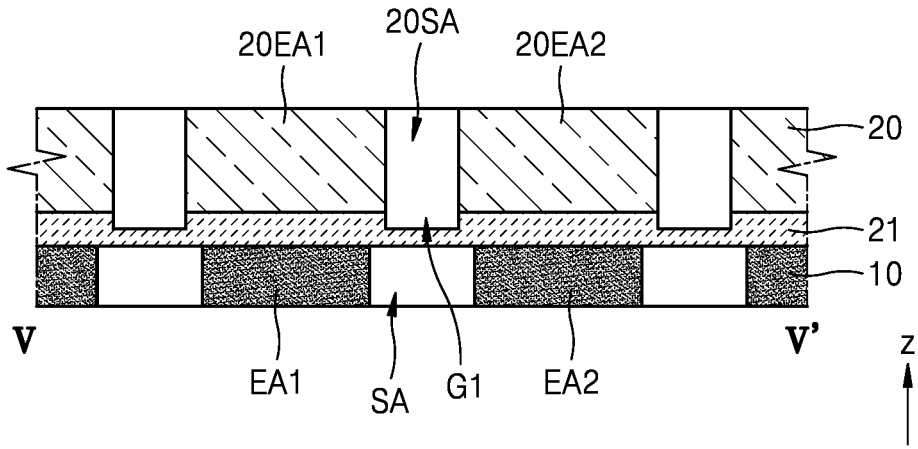
Figure 8C:
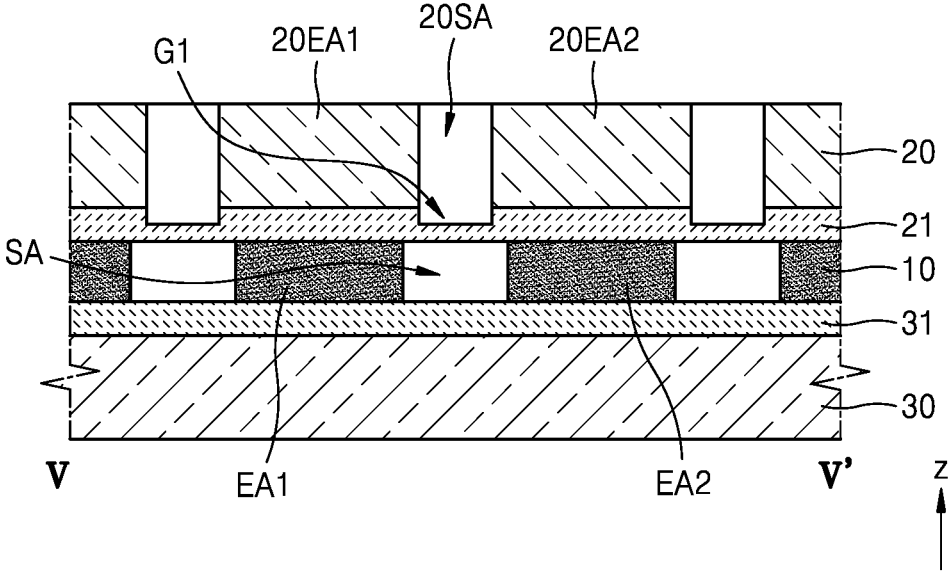

FIGS. 8A to 8C are cross-sectional views for describing an operation of preparing a display panel from among operations of a method of manufacturing a display apparatus according to an embodiment. In the operation of preparing a display panel, the display panel 10 may be in a flat state in which the first area A1, the second area A2, the middle area MA, the peripheral area PA, and the corner area CNA are not bent. The upper organic layer 20 and the lower organic layer 30, which are attached to the display panel may be in a flat state in which areas corresponding to the first area A1, the second area A2, the middle area MA, the peripheral area PA, and the corner area CNA of the display panel 10 are not bent.

In an embodiment, as shown in FIG. 8A, the upper organic layer 20 may be attached to an upper surface (in the +z direction) of the display panel 10, where the upper organic layer 20 is attached to an upper organic layer adhesive layer 21. That is, the upper organic layer 20 may be attached to the display panel 10 by using the upper organic layer adhesive layer 21.

As described above, the display panel 10 may include the corner area CNA arranged at a corner of the central area CA, and the corner area CNA may include the extension area EA and the separation area SA. A plurality of extension areas EA may be provided, and a plurality of separation areas SA may be provided. The separation area SA may be disposed between adjacent extension areas EA. In an embodiment, the plurality of extension areas EA may include a first extension area EA1 and a second extension area EA2, and the second extension area EA2 may be spaced apart from the first extension area EA1. The separation area SA may be defined between the first extension area EA1 and the second extension area EA2.

The upper organic layer 20 may have a large modulus. In an embodiment, the modulus of the upper organic layer 20 may be in a range of about 0.5 gigapascals (GPa) to about 3 GPa, e.g., the modulus of the upper organic layer 20 may be in a range of about 1 GPa to about 2 GPa. The upper organic layer 20 may include at least one selected from polyethylene terephthalate (PET), polyimide, polyethylene naphthalate, polyarylate, polycarbonate, polyetherimide (PEI), and polyethersulfone. The upper organic layer adhesive layer 21 may include at least one selected from an optical clear resin (OCR), an optical clear adhesive (OCA), and a pressure sensitive adhesive (PSA).

When a stacked structure including the display panel 10 is bent, a compressive stress or tensile stress may be applied to portions of the stacked structure according to the positions of the portions. In such a stacked structure, a neutral plane, which is a position where the compressive stress and the tensile stress are zero, may exist. That is, when the stacked structure including the display panel 10 is bent, based on the neutral plane, a compressive stress may be applied to the inside of the neutral plane, and a tensile stress may be applied to the outside of the neutral plane. When a distance of portions of the stacked structure from the neutral plane increases, a greater compressive or tensile stress may be applied. The upper organic layer 20 may move the neutral plane in the stacked structure including the display panel 10. In an embodiment, a stress applied to the display panel 10 may be adjusted by appropriately adjusting the thickness and/or modulus of the upper organic layer 20. Accordingly, in such an embodiment, no stress may be applied to the display panel 10, or even when there is stress, the stress may be minimized.

Then, as shown in FIG. 8B, a portion of the upper organic layer 20 in the corner area CNA is cut by using a laser beam, and thus, a first upper organic layer extension area 20EA1 overlapping the first extension area EA1 and a second upper organic layer extension area 20EA2 overlapping the second extension area EA2 may be formed. In an embodiment, for example, the upper organic layer 20 is cut along the separation area SA by using a laser beam, and thus, the first upper organic layer extension area 20EA1 and the second upper organic layer extension area 20EA2 may be formed.

That is, the first upper organic layer extension area 20EA1 and the second upper organic layer extension area 20EA2 may be spaced apart from each other, and an upper organic layer separation area 20SA may be defined between the first upper organic layer extension area 20EA1 and the second upper organic layer extension area 20EA2. The upper organic layer separation area 20SA may overlap the separation area SA. The laser beam used may be an excimer laser. Alternatively, the laser beam may be a $CO_2$ laser, an yttrium aluminum garnet (YAG) laser, a nano second laser, a femto second laser, a Bessel beam, a Gaussian beam, or the like.

A first groove G1 may be formed on an upper surface (in a +z direction) of the upper organic layer adhesive layer 21 at the same time as the first upper organic layer extension area 20EA1 and the second upper organic layer extension area 20EA2 are formed. In an embodiment, as the upper organic layer 20 is cut along the separation area SA of the display panel 10, the upper organic layer adhesive layer 21 disposed below the upper organic layer 20 may also be cut. The upper organic layer adhesive layer 21 may be cut by a depth that is less than the thickness of the upper organic layer adhesive layer 21 in a thickness direction (e.g., a z-axis direction) of the upper organic layer adhesive layer 21. In an embodiment, the upper organic layer adhesive layer 21 disposed below the upper organic layer 20 may be half-cut. Accordingly, the first groove G1 may be formed on the upper surface (in the +z direction) of the upper organic layer adhesive layer 21.

When a stacked structure including the display panel 10 is bent, a distance between the first extension area EA1 and the second extension area EA2 of the display panel 10 may be reduced. If the upper organic layer 20 in the corner area CNA are integrally provided on the first extension area EA1, the separation area SA, and the second extension area EA2 of the display panel 10, a distance between a portion of the upper organic layer 20, the portion overlapping the first extension area EA1, and another portion of the upper organic layer 20, the other portion overlapping the second extension area EA2, may not be easily reduced. Accordingly, the upper organic layer 20 in the corner area CNA may not be in close contact with the display panel 10 and may fall off and become crumpled. That is, the upper organic layer 20 may be buckled in the corner area CNA.

In an embodiment of a method of manufacturing a display apparatus, the first upper organic layer extension area 20EA1 and the second upper organic layer extension area 20EA2 may be spaced apart from each other, and the upper organic layer separation area 20SA may be defined between the first upper organic layer extension area 20EA1 and the second upper organic layer extension area 20EA2, which are adjacent to each other. Accordingly, when a distance between the first extension area EA1 and the second extension area EA2 of the display panel 10 is reduced as the stacked structure including the display panel 10 is bent, a distance between the first upper organic layer extension area 20EA1 overlapping the first extension area EA1 and the second upper organic layer extension area 20EA2 overlapping the second extension area EA2 may also be reduced. Accordingly, the upper organic layer 20 may not be buckled in the corner area CNA. That is, the possibility of occurrence of defects in an operation of manufacturing the display apparatus 1 may be reduced.

Then, as shown in FIG. 8C, the lower organic layer 30 to which a lower organic layer adhesive layer 31 is attached may be attached to a lower surface (in the −z direction) of the display panel 10. That is, the lower organic layer 30 may be attached to the display panel 10 by using the lower organic layer adhesive layer 31.

The lower organic layer 30 may include a silicon-based compound. The silicon-based compound may be an organo-silicon compound including silicon. In an embodiment, the silicon-based compound may include a siloxane-based polymer material. In an embodiment, for example, the silicon-based compound may include polydimethylsiloxane. In an embodiment where the lower organic layer 30 includes a silicon-based material, the modulus of the lower organic layer 30 may be low, and the shape of the lower organic layer 30 may be easily transformed by using a small force. Accordingly, the lower organic layer 30 may be easily shaped. The lower organic layer adhesive layer 31 may include at least one selected from an OCR, an OCA, and a PSA.

Figure 9:
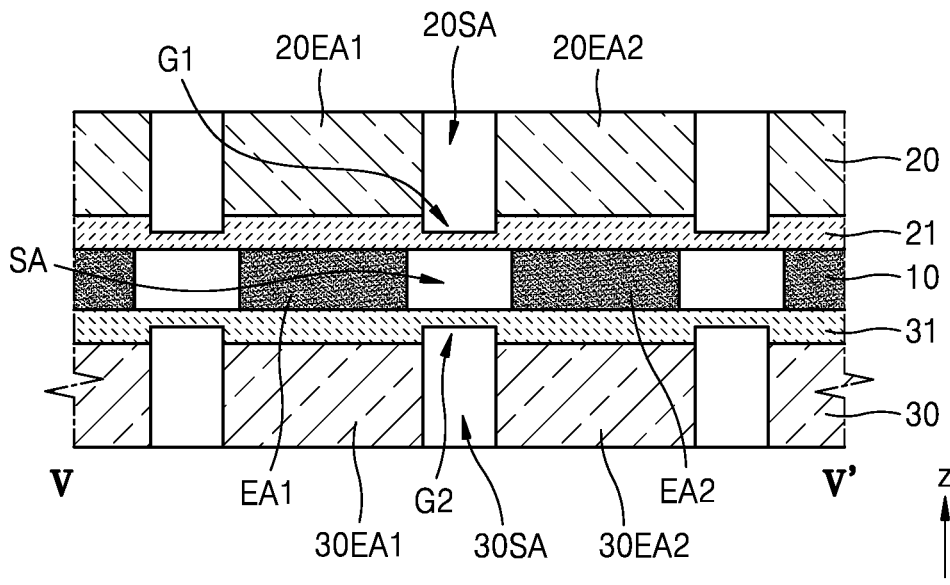
FIG. 9 is a schematic cross-sectional view for describing a method of manufacturing a display apparatus according to an embodiment.

FIG. 9 is a schematic cross-sectional view for describing a method of manufacturing a display apparatus according to an embodiment. FIG. 9 shows an alternative embodiment corresponding to the embodiments of FIGS. 8A to 8C. The same or like elements shown in FIG. 9 have been labeled with the same reference characters as used above to describe those shown in FIGS. 8A to 8C, and any repetitive detailed description thereof will hereinafter be omitted or simplified.

In an embodiment of the method of manufacturing a display apparatus shown in FIG. 9, the upper organic layer 20, to which the upper organic layer adhesive layer 21 is attached, is attached to an upper surface (in the +z direction) of the display panel 10, and a portion of the upper organic layer 20 in the corner area CNA is cut, and thus, the first upper organic layer extension area 20EA1 and the second upper organic layer extension area 20EA2 may be formed, and the lower organic layer 30, to which the lower organic layer adhesive layer 31 is attached, may be attached to a lower surface (in the −z direction) of the display panel 10 as described above with reference to FIGS. 8A to 8C.

In an embodiment of the method of manufacturing a display apparatus, the lower organic layer 30 may include at least one selected from PET, polyimide, polyethylene naphthalate, polyarylate, polycarbonate, PEI, and polyether-sulfone. Accordingly, the lower organic layer 30 may have a large modulus. In an embodiment, the modulus of the lower organic layer 30 may be in a range of about 0.5 GPa to about 3 GPa, e.g., the modulus of the lower organic layer 30 may be in a range of about 1 GPa to about 2 GPa.

In such an embodiment, as shown in FIG. 9, as a portion of the lower organic layer 30 below the corner area CNA is cut by using a laser beam, a first lower organic layer extension area 30EA1 overlapping the first extension area EA1 and a second lower organic layer extension area 30EA2 overlapping the second extension area EA2 may be formed. In an embodiment, for example, as the lower organic layer 30 is cut along the separation area SA of the display panel 10, the first lower organic layer extension area and the second lower organic layer extension area 30EA2 may be formed.

That is, the first lower organic layer extension area 30EA1 and the second lower organic layer extension area 30EA2 may be spaced apart from each other, and a lower organic layer separation area 30SA may be defined between the first lower organic layer extension area 30EA1 and the second lower organic layer extension area 30EA2. The lower organic layer separation area 30SA may overlap the separation area SA. The laser beam used may be an excimer laser. Alternatively, the laser beam may be a CO2 laser, a YAG laser, a nano second laser, a femto second laser, a Bessel beam, a Gaussian beam, or the like.

A second groove G2 may be formed on a lower surface (in a −z direction) of the lower organic layer adhesive layer 31 at the same time as the first lower organic layer extension area 30EA1 and the second lower organic layer extension area 30EA2 are formed. In an embodiment, as the lower organic layer 30 is cut along the separation area SA of the display panel 10, the lower organic layer adhesive layer 31 disposed on the lower organic layer 30 may also be cut. The lower organic layer adhesive layer 31 may be cut by a depth that is less than the thickness of the lower organic layer adhesive layer 31 in a thickness direction (e.g., the z-axis direction) of the lower organic layer adhesive layer 31. In an embodiment, for example, the lower organic layer adhesive layer 31 disposed on the lower organic layer 30 may be half-cut. Accordingly, the second groove G2 may be formed on the lower surface (in the −z direction) of the lower organic layer adhesive layer 31.

Similarly to the case of the upper organic layer 20, when the lower organic layer 30 in the corner area CNA are integrally provided below the first extension area EA1, the separation area SA, and the second extension area EA2 of the display panel 10, a distance between a portion of the lower organic layer 30, the portion overlapping the first extension area EA1, and another portion of the lower organic layer 30, the other portion overlapping the second extension area EA2, may not be easily reduced. Accordingly, the lower organic layer 30 in the corner area CNA may not be in close contact with the display panel 10 and may fall and become crumpled. That is, the lower organic layer 30 may be buckled in the corner area CNA.

In an embodiment of a method of manufacturing a display apparatus, the first lower organic layer extension area 30EA1 and the second lower organic layer extension area 30EA2 may be spaced apart from each other, and the lower organic layer separation area 30SA may be defined between the first lower organic layer extension area 30EA1 and the second lower organic layer extension area 30EA2, which are adjacent to each other. Accordingly, when the distance between the first extension area EA1 and the second extension area EA2 of the display panel 10 is reduced as the central corner area CCA is bent at the corner CN, the distance between the first lower organic layer extension area 30EA1 overlapping the first extension area EA1 and the second lower organic layer extension area 30EA2 overlapping the second extension area EA2 may also be reduced. Accordingly, the lower organic layer 30 may not be buckled in the corner area CNA. That is, the possibility of occurrence of defects in an operation of manufacturing the display apparatus 1 may be reduced.

Figure 10A:
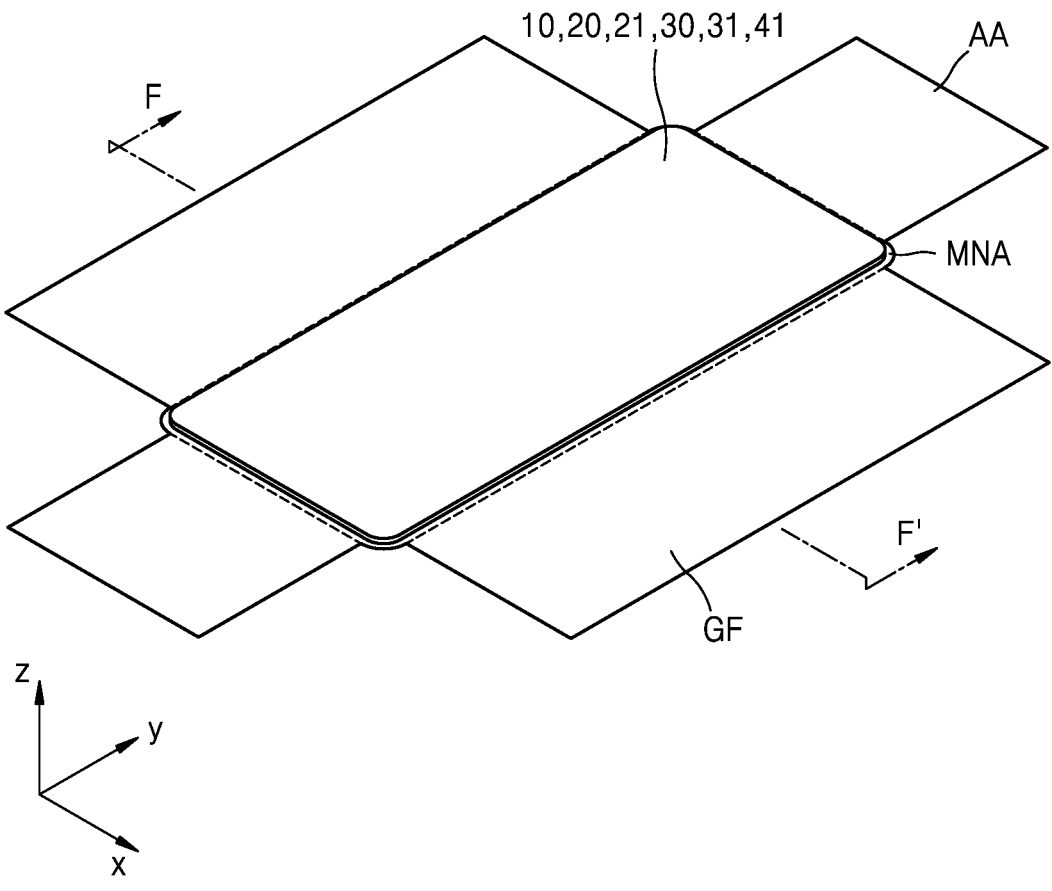
FIGS. 10A and 10B are diagrams for describing an operation of attaching a guide film to a display panel from among operations of a method of manufacturing a display apparatus according to an embodiment.
Figure 10B:
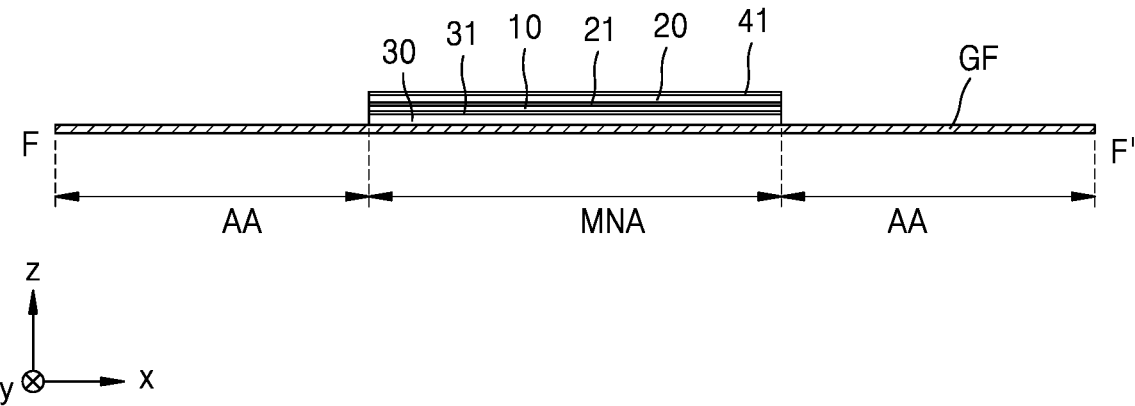

FIGS. 10A and 10B are diagrams for describing an operation of attaching a guide film to a display panel from among operations of a method of manufacturing a display apparatus according to an embodiment. In particular, FIG. 10B is a cross-sectional view taken along line F-F' of FIG. 10A, schematically illustrating a guide film GF, the upper organic layer 20, the upper organic layer adhesive layer 21, the display panel 10, the lower organic layer 30, the lower organic layer adhesive layer 31, and a cover window adhesive layer 41 of FIG. 10A.

As shown in FIGS. 10A and 10B, the guide film GF may be attached to a lower portion of the display panel 10. In an embodiment, the guide film GF may be attached to a lower surface (in a −z direction) of the lower organic layer 30 attached to the lower portion of the display panel 10. The cover window adhesive layer 41 may be attached to an upper surface (in a +z direction) of the upper organic layer 20 attached to an upper portion of the display panel 10. That is, the display panel 10 may be in a state in which the upper organic layer adhesive layer 21, the upper organic layer 20, and the cover window adhesive layer 41 are attached to the upper portion of the display panel 10, and the lower organic layer adhesive layer 31, the lower organic layer 30, and the guide film GF are attached to the lower portion of the display panel 10.

The guide film GF may include a main area MNA and an auxiliary area AA. A plurality of auxiliary areas AA may be provided, and each of the plurality of auxiliary areas AA may extend from an edge of the main area MNA. The guide film GF may be attached to the lower portion of the display panel 10 such that the display panel 10 corresponds to the main area MNA of the guide film GF. In an embodiment, the guide film GF may be attached to the lower portion of the display panel 10 in a way such that the display panel 10 entirely corresponds to the main area MNA of the guide film GF. That is, the auxiliary area AA of the guide film GF may not overlap the display panel 10.

As described above with reference to FIGS. 8A to 8C, the upper organic layer 20 and the upper organic layer adhesive layer 21 may be cut along the separation area SA of the display panel 10 by using a laser beam, and the lower organic layer 30 and the lower organic layer adhesive layer 31 may not be cut. Alternatively, as described above with reference to FIG. 9, the upper organic layer 20, the upper organic layer adhesive layer 21, the lower organic layer 30, and the lower organic layer adhesive layer 31 may be cut along the separation area SA of the display panel 10 by using a laser beam.

The cover window adhesive layer 41 may attach the cover window 40 to the upper portion of the display panel 10. The cover window adhesive layer 41 may include at least one of an OCR, an OCA, and a PSA. Although not illustrated in FIGS. 10A and 10B, an adhesive member may be between a lower surface (in the −z direction) of the lower organic layer 30 and the guide film GF. In such an embodiment, the guide film GF may be attached to the display panel 10, to which the lower organic layer 30 is attached, by using the adhesive member. The adhesive member may be a transparent adhesive member such as an OCA film.

Figure 11:
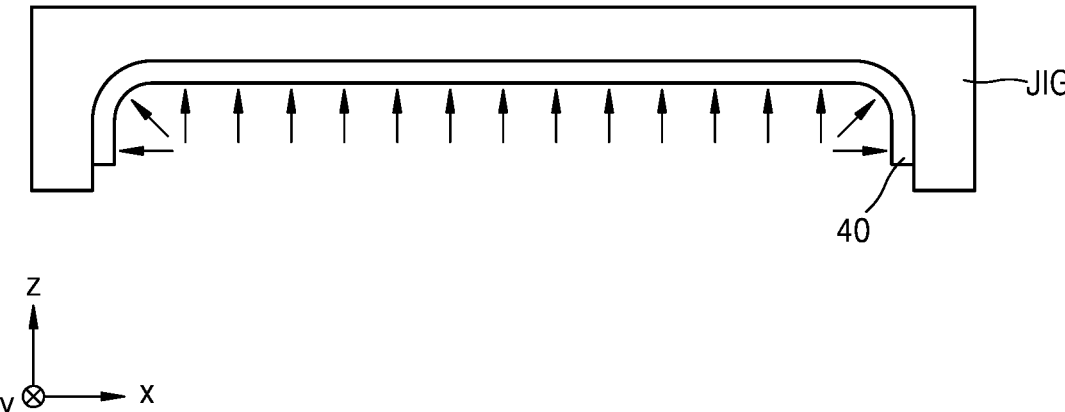
FIG. 11 is a diagram for describing an operation of preparing a cover window among operations of a method of manufacturing a display apparatus according to an embodiment.

FIG. 11 is a diagram for describing an operation of preparing a cover window among operations of a method of manufacturing a display apparatus according to an embodiment. As shown in FIG. 11, the cover window 40 may be prepared. The cover window 40 may be transformed to have a flat surface and a curved surface by using a jig JIG including a concave surface corresponding to the final shape of the cover window 40. That is, the jig JIG may be a frame having the shape of the display apparatus 1 to be finally manufactured. The cover window 40 may be transformed according to the shape of the concave surface of the jig JIG by placing the cover window 40 to be in close contact with the concave surface of the jig JIG.

Figure 12A:
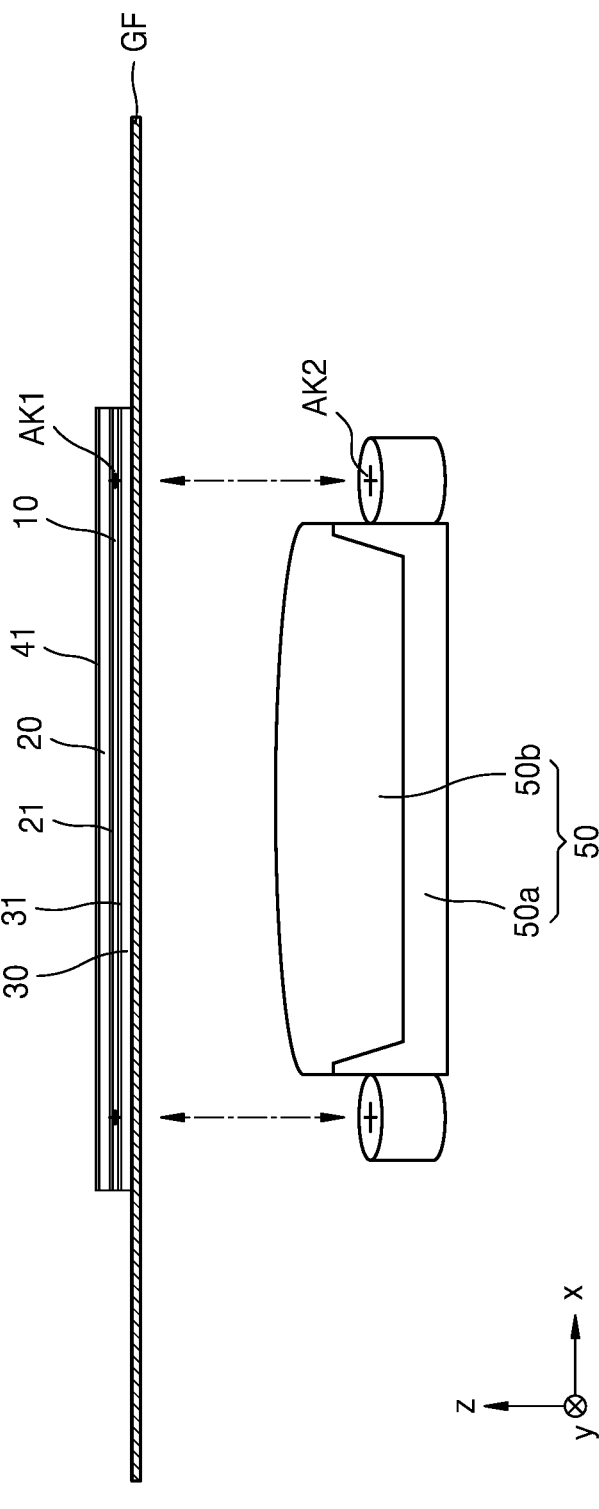
FIGS. 12A and 12B are diagrams for describing an operation of pre-shaping a display panel from among operations of a method of manufacturing a display apparatus according to an embodiment.
Figure 12B:
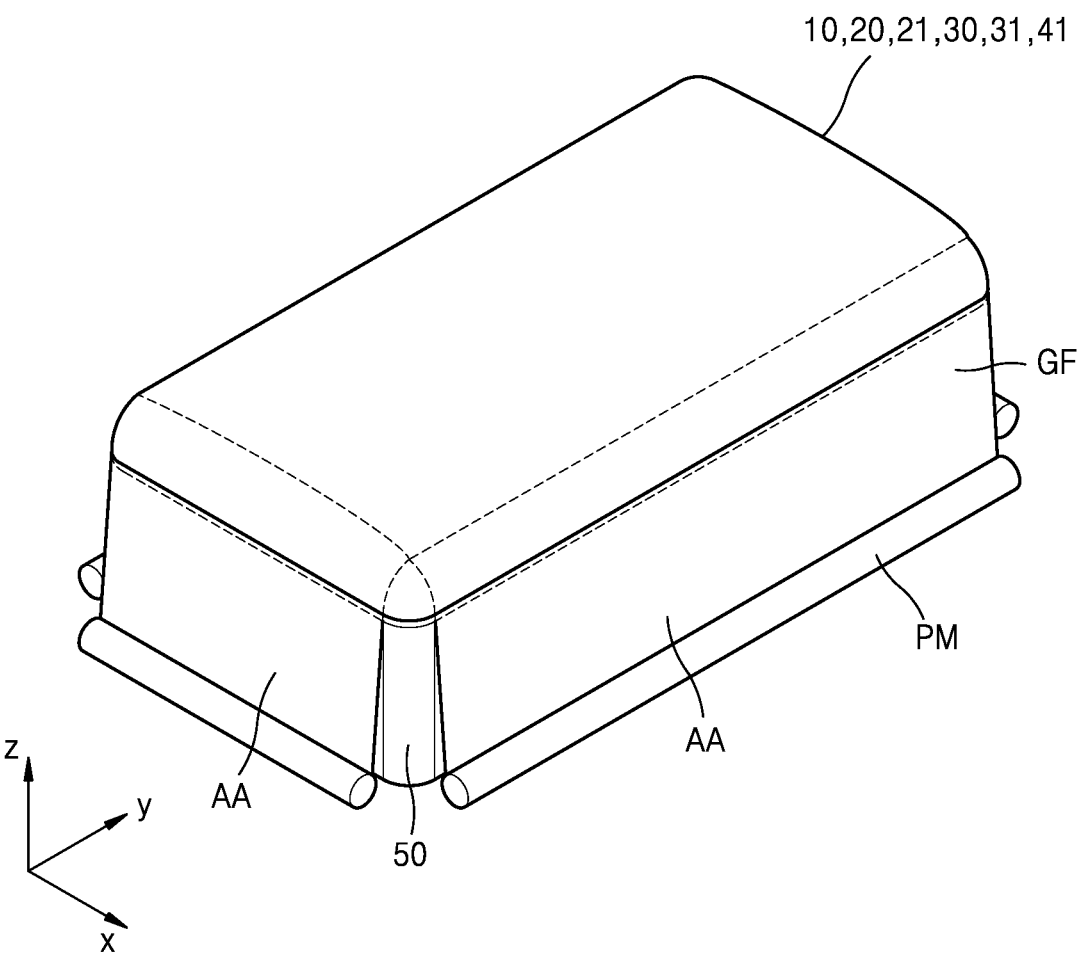

FIGS. 12A and 12B are diagrams for describing an operation of pre-shaping a display panel from among operations of a method of manufacturing a display apparatus according to an embodiment. As shown in FIGS. 12A and 12B, the shape of the display panel 10 may be transformed by applying an external force to the guide film GF. In an embodiment, the display panel 10 may be pre-shaped by applying an external force to the guide film GF.

First, as shown in FIG. 12A, after arranging a lower surface (in the −z direction) of the display panel 10, to which the guide film GF is attached, to face a pad unit 50, the display panel 10 and the pad unit 50 may be aligned. In an embodiment, the display panel 10 and the pad unit 50 may be aligned such that a first alignment key AK1 displayed on the display panel 10 coincides with a second alignment key AK2 displayed on the pad unit 50.

The pad unit 50 may include a first pad unit 50a and a second pad unit 50b. The first pad unit 50a may support the second pad unit 50b. The second pad unit 50b may include an air pump, or may be connected to an air pump. Because the second pad unit 50b has a low modulus, the shape and volume of the second pad unit 50b may vary due to the air pressure through the air pump. Alternatively, the second pad unit 50b may include a diaphragm.

As shown in FIG. 12B, the guide film GF attached to the lower surface (in the −z direction) of the display panel 10 may be seated on the pad unit 50. A push member PM may be disposed on the guide film GF, and the guide film GF may be moved to be in close contact with side surfaces of the pad unit 50 by using the push member PM. In an embodiment, for example, as push members PM press the edges of the guide film GF, respectively, while a tensile force may be applied to the guide film GF, and the guide film GF may be transformed to correspond to an outer surface of the pad unit 50, the display panel 10 on the guide film GF may also be transformed such as being appropriately bent. The cover window adhesive layer 41, the upper organic layer 20, the upper organic layer adhesive layer 21, the lower organic layer 30, and the lower organic layer adhesive layer 31, which are attached to the upper portion or lower portion of the display panel 10, may also be transformed. Accordingly, the display panel 10, the cover window adhesive layer 41, the upper organic layer 20, the upper organic layer adhesive layer 21, the lower organic layer 30, and the lower organic layer adhesive layer 31 may each be pre-shaped into a shape corresponding to the cover window 40.

Figure 13A:
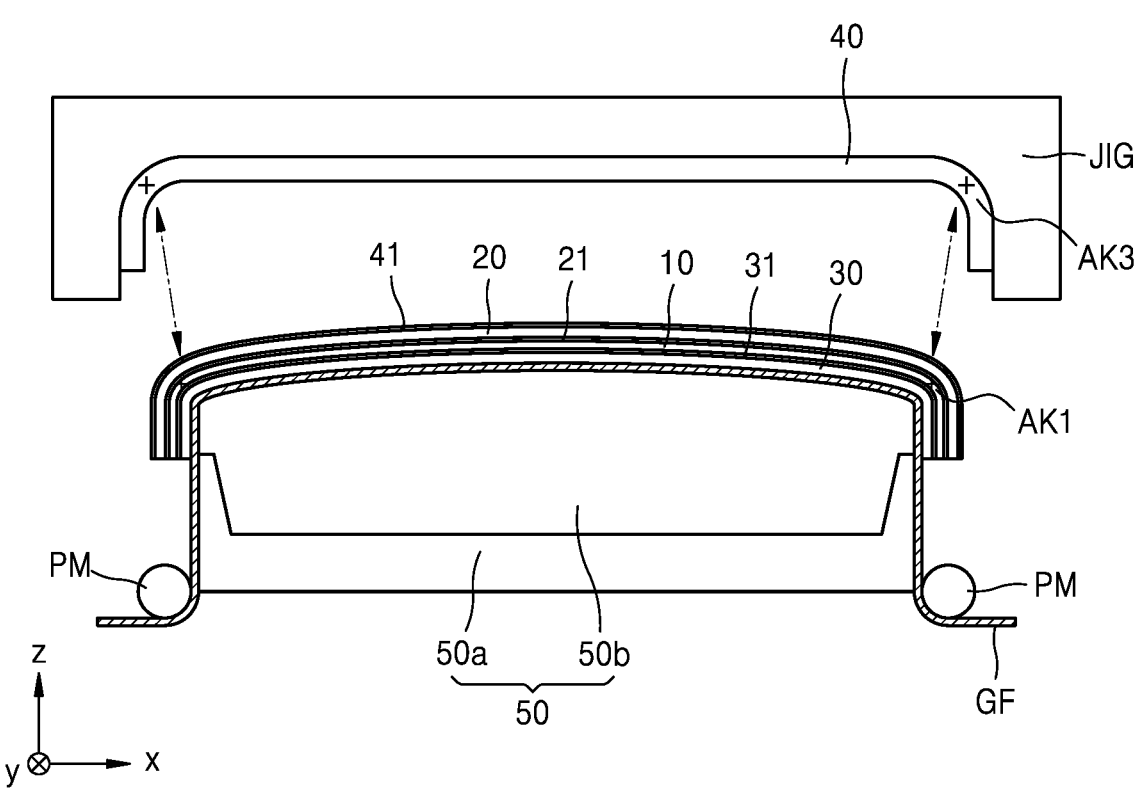
FIGS. 13A to 13C are diagrams for describing an operation of attaching a cover window to a display panel from among operations of a method of manufacturing a display apparatus according to an embodiment.
Figure 13B:
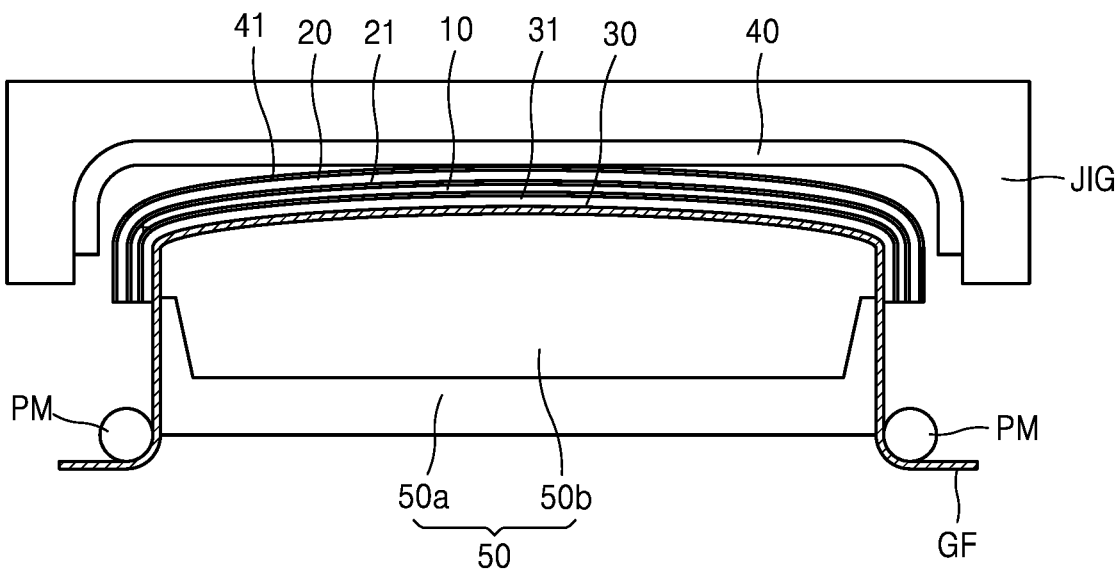
Figure 13C:
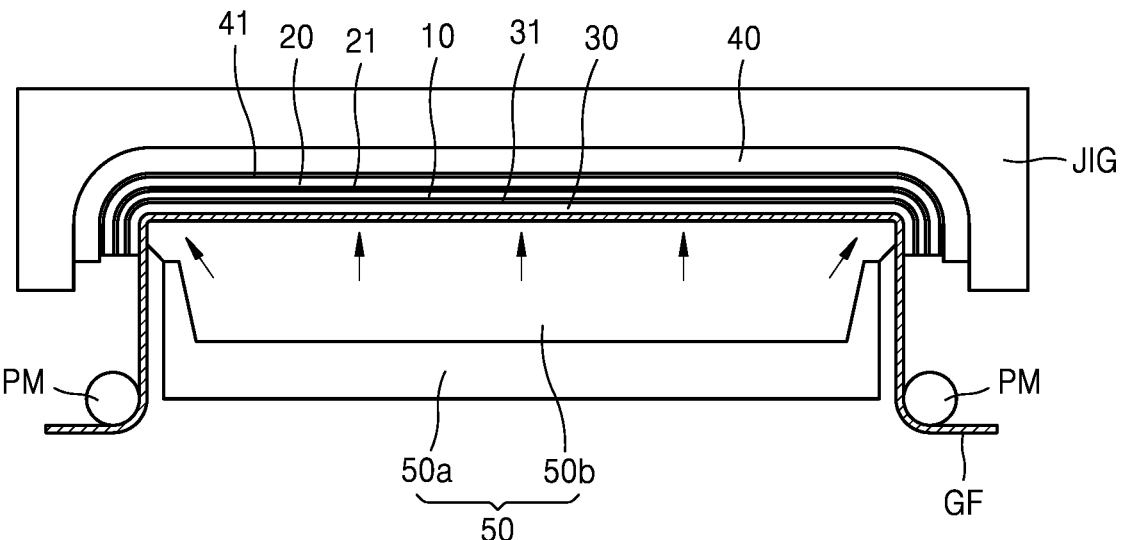

FIGS. 13A to 13C are diagrams for describing an operation of attaching a cover window to a display panel from among operations of a method of manufacturing a display apparatus according to an embodiment.

First, as shown in FIG. 13A, after the upper surface (in the +z direction) of the display panel 10 is arranged to face the cover window 40, the display panel 10 and the cover window 40 may be aligned. In an embodiment, the display panel 10 and the cover window 40 may be aligned in a way such that the first alignment key AK1 displayed on the display panel 10 coincides with a third alignment key AK3 displayed on the cover window 40.

Then, as shown in FIGS. 13B and 13C, the cover window 40 may be attached to the display panel 10 by using the pad unit 50. In an embodiment, the cover window 40 may be attached to an upper surface (in the +z direction) of the upper organic layer 20 to which the display panel 10 is attached. As shown in FIG. 13B, a portion of the display panel 10 may be firstly attached to the cover window 40. A flat surface (e.g., the central area CA) having no curvature in the final shape of the display panel 10 may be firstly attached to the cover window 40.

Then, as shown in FIG. 13C, as the shape of the second pad unit 50b of the pad unit 50 is transformed and the volume thereof increases, remaining portions of the display panel 10, for example, the first area A1, the second area A2, and the corner area CNA, may be attached to the cover window 40. An operation of attaching the first area A1 and the second area A2 to the cover window 40 and an operation of attaching the corner area CNA to the cover window 40 may be simultaneously performed. In an embodiment, for example, when the first area A1 and the second area A2 are attached to the cover window 40, the corner area CNA may be naturally attached to the cover window 40 by a surrounding external force. In an alternative embodiment, for example, an operation of attaching the first area A1 and the second area A2 to the cover window 40 and an operation of attaching the corner area CNA to the cover window 40 may be performed at different timings. In an embodiment, for example, after the first area A1 and the second area A2 are firstly attached to the cover window 40, the corner area CNA may be attached to the cover window 40. After the display panel 10 is attached to the cover window 40, the display panel 10 to which the cover window 40 is attached may be separated from the jig JIG and the pad unit 50.

The cover window 40 may protect the upper surface of the display panel 10. The cover window 40 may protect the display panel 10 while being easily bent by an external force without occurrence of cracks or the like. The cover window 40 may include glass, sapphire, or plastic. In an embodiment, for example, the cover window 40 may be an ultrathin glass (UTG®) or colorless polyimide (CPI) of which the strength is strengthened by a method such as chemical strengthening, thermal strengthening, or the like. The cover window 40 may have a structure in which a flexible polymer layer is disposed on one surface of a glass substrate, or may only include a polymer layer.

In the operation of attaching the cover window 40 to the display panel 10, a significant size of compressive stress or tensile stress may be applied to the display panel 10. When the compressive stress or tensile stress applied to the display panel 10 exceeds a limit stress of the display panel 10, cracks may be generated in the display panel 10, for example, a crack may be generated in the thin-film transistor TFT provided in the display panel 10 or a line connected to each pixel PX.

In the method of manufacturing a display apparatus according to an embodiment, the upper organic layer 20 having a large modulus may be attached to the upper surface (in the +z direction) of the display panel 10. Accordingly, the position of the neutral plane of the display apparatus 1 may be moved, and the neutral plane may be positioned on the display panel 10. That is, a stress applied to the display panel 10 may be adjusted, and accordingly, there is no stress applied to the display panel 10, or even there is stress, the stress may be minimized. Accordingly, no compressive stress or tensile stress exceeding the limit stress is applied to the display panel 10, and thus, no crack may be generated in the display panel 10, or even when there is a crack, the degree of the crack may be minimized. That is, the possibility of occurrence of defects in an operation of manufacturing the display apparatus 1 may be reduced.

In the method of manufacturing a display apparatus according to an embodiment, the upper organic layer 20 attached to the upper surface (in the +z direction) of the display panel 10 may include the first upper organic layer extension area 20EA1 and the second upper organic layer extension area 20EA2, and the upper organic layer separation area 20SA may be defined between the first upper organic layer extension area 20EA1 and the second upper organic layer extension area 20EA2. Accordingly, the upper organic layer 20 may not be buckled in the corner area CNA. Optionally, the lower organic layer 30 attached to the lower surface (in the −z direction) of the display panel 10 may include the first lower organic layer extension area 30EA1 and the second lower organic layer extension area 30EA2, and the lower organic layer separation area 30SA may be defined between the first lower organic layer extension area 30EA1 and the second lower organic layer extension area 30EA2. Accordingly, the lower organic layer 30 may not be buckled in the corner area CNA.

Embodiments of the method of manufacturing a display apparatus are described above, but the disclosure is not limited thereto. For example, an embodiment of the display apparatus 1 manufactured by the method of manufacturing a display apparatus also falls within the scope of the disclosure. Hereinafter, an embodiment of the display apparatus 1 will be described. Particularly, the structure of the display apparatus 1 will be described. Hereinafter, any repetitive detailed description of the elements of the display apparatus 1 the same as those described above with reference to FIGS. 1A to 13C will be omitted or simplified.

Figure 14:
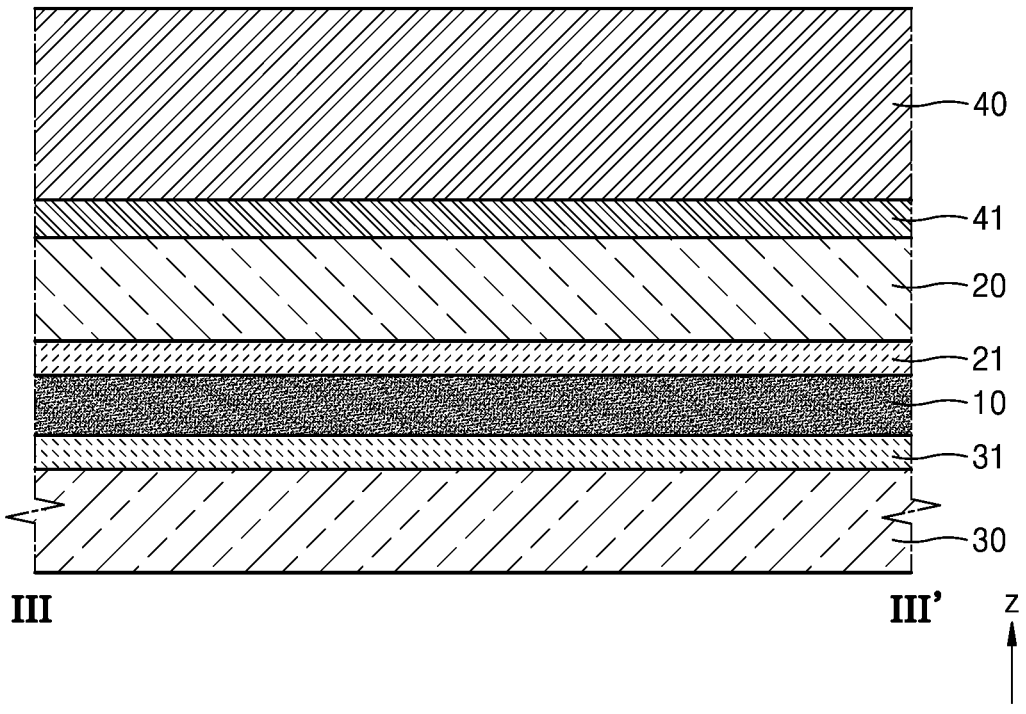
FIG. 14 is a schematic cross-sectional view of the display apparatus, taken along line III-III' of FIG. 1A.
Figure 15:
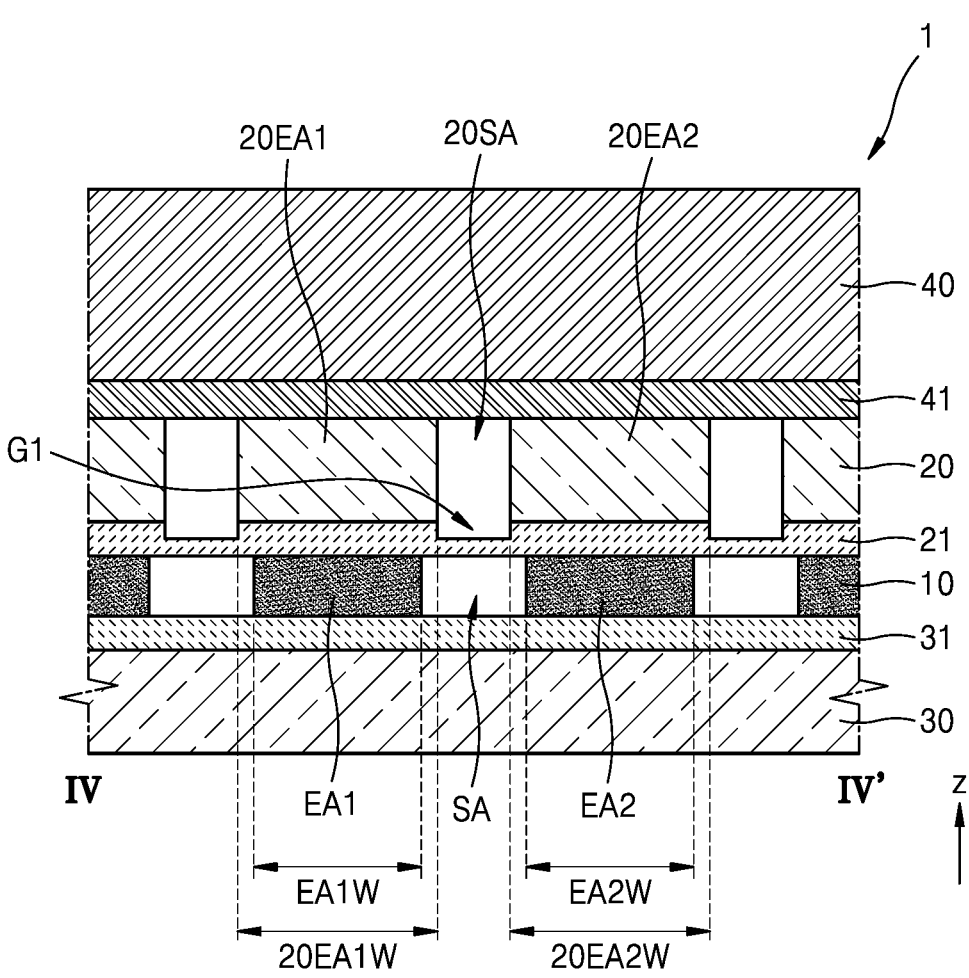
FIG. 15 is a schematic cross-sectional view of the display apparatus, taken along line IV-IV' of FIG. 1A.

FIGS. 14 and 15 are cross-sectional views illustrating a portion of the display apparatus 1 according to an embodiment. In particular, FIG. 14 is a cross-sectional view taken along line III-III' of FIG. 1A, schematically illustrating the display apparatus 1 of FIG. 1A, and FIG. 15 is a cross-sectional view taken along line IV-IV' of FIG. 1A, schematically illustrating the display apparatus 1 of FIG. 1A. In an embodiment, for example, a display apparatus manufactured by using a manufacturing method including an operation of preparing a display panel as described above with reference to FIGS. 8A to 8C may have the same structure as those shown in FIGS. 14 and 15.

As shown in FIG. 14, an embodiment of the display apparatus 1 may include the display panel 10, the upper organic layer 20, the lower organic layer 30, and the cover window 40. The display apparatus 1 may further include the upper organic layer adhesive layer 21, the lower organic layer adhesive layer 31, and the cover window adhesive layer 41.

The upper organic layer 20 may be disposed on an upper portion of the display panel 10 to face the upper surface (in a +z direction) of the display panel 10. The upper organic layer 20 may adjust a neutral plane in the display apparatus 1, and thus, the occurrence of cracks in the display panel 10 may be prevented or minimized. The upper organic layer adhesive layer 21 may be between the upper organic layer 20 and the display panel 10. The upper organic layer 20 may be attached to the upper portion of the display panel 10 by the upper organic layer adhesive layer 21.

The upper organic layer 20 may have a large modulus. In an embodiment, the modulus of the upper organic layer 20 may be in a range of about 0.5 GPa to about 3 GPa, for example, the modulus of the upper organic layer 20 may be in a range of about 1 GPa to about 2 GPa. The upper organic layer 20 may include at least one selected from PET, polyimide, polyethylene naphthalate, polyarylate, polycarbonate, PEI, and polyethersulfone.

The lower organic layer 30 may be disposed on the lower portion of the display panel 10 to face the lower surface (in a −z direction) of the display panel 10. The lower organic layer 30 may protect the display panel 10 in an operation of manufacturing the display apparatus 1. The lower organic layer adhesive layer 31 may be between the lower organic layer 30 and the display panel 10. The lower organic layer 30 may be attached to the lower portion of the display panel 10 by the lower organic layer adhesive layer 31.

The cover window 40 may be disposed above the display panel 10. In an embodiment, the cover window 40 may be disposed above the upper organic layer 20. The cover window 40 may protect the upper surface of the display panel 10. The cover window 40 may protect the display panel 10 while being easily bent by an external force without occurrence of cracks or the like. The cover window adhesive layer 41 may be between the cover window 40 and the upper organic layer 20. The cover window 40 may be attached to the upper portion of the display panel 10 by the cover window adhesive layer 41.

In an embodiment, as described above, the display panel 10 may include the corner area CNA arranged at a corner of the central area CA, and the corner area CNA may include the extension area EA and the separation area SA. A plurality of extension areas EA may be provided, and a plurality of separation areas SA may be provided. The separation area SA may be disposed between adjacent extension areas EA. That is, the plurality of extension areas EA may include the first extension area EA1 and the second extension area EA2, and the second extension area EA2 may be spaced apart from the first extension area EA1. The separation area SA may be defined between the first extension area EA1 and the second extension area EA2.

In an embodiment, as shown in FIG. 15, the upper organic layer 20 disposed above the display panel 10 may include the first upper organic layer extension area 20EA1 and the second upper organic layer extension area 20EA2 in the corner area CNA. In such an embodiment, the first upper organic layer extension area 20EA1 and the second upper organic layer extension area 20EA2 may be arranged in the corner area CNA. The first upper organic layer extension area 20EA1 may overlap the first extension area EA1, and the second upper organic layer extension area 20EA2 may overlap the second extension area EA2.

The second upper organic layer extension area 20EA2 may be spaced apart from the first upper organic layer extension area 20EA1. In an embodiment, the upper organic layer separation area 20SA may be defined between the first upper organic layer extension area 20EA1 and the second upper organic layer extension area 20EA2, which are adjacent to each other. The upper organic layer separation area 20SA may be an area in which the upper organic layer 20 is not arranged. The upper organic layer separation area 20SA may overlap the separation area SA.

In a cross-sectional view taken along a plane perpendicular to the display panel 10 and passing through the first upper organic layer extension area 20EA1, the second upper organic layer extension area 20EA2, the first extension area EA1, and the second extension area EA2, a separation distance between the first upper organic layer extension area 20EA1 and the second upper organic layer extension area 20EA2 may be less than or equal to a separation distance between the first extension area EA1 and the second extension area EA2. That is, in the cross-sectional view, as shown in FIG. 15, a width 20EA1W of the first upper organic layer extension area 20EA1 may be greater than or equal to a width EA1W of the first extension area EA1. In the cross-sectional view, as shown in FIG. 15, a width 20EA2W of the second upper organic layer extension area 20EA1W may be greater than or equal to a width EA2W of the second extension area EA2.

The upper organic layer adhesive layer 21 may be between the display panel 10 and the upper organic layer 20. The upper organic layer adhesive layer 21 may be integrally provided over the entire surface of the display panel 10. In an embodiment, the upper organic layer adhesive layer 21 may be integrally provided on the first extension area EA1, the second extension area EA2, and the separation area SA. The upper organic layer adhesive layer 21 may further include the first groove G1. The first groove G1 may be disposed on an upper surface (in a +z direction) of the upper organic layer adhesive layer 21. The first groove G1 may overlap the separation area SA. The first groove G1 may also overlap the upper organic layer separation area 20SA.

The lower organic layer 30 disposed on the lower portion of the display panel 10 may be integrally provided over the entire surface of the display panel 10. In an embodiment, the lower organic layer 30 may be integrally provided below the first extension area EA1, the second extension area EA2, and the separation area SA in the corner area CNA. The lower organic layer 30 may include a silicon-based compound. The silicon-based compound may be an organosilicon compound including silicon. In an embodiment, the silicon-based compound may include a siloxane-based polymer material. In an embodiment, for example, the silicon-based compound may include polydimethylsiloxane.

The lower organic layer 30 may be attached to the lower surface (in the −z direction) of the display panel 10 by the lower organic layer adhesive layer 31 between the display panel 10 and the lower organic layer 30. The lower organic layer adhesive layer 31 may be integrally provided over the entire surface of the display panel 10. In an embodiment, the lower organic layer adhesive layer 31 may be integrally provided below the first extension area EA1, the second extension area EA2, and the separation area SA.

Figure 16:
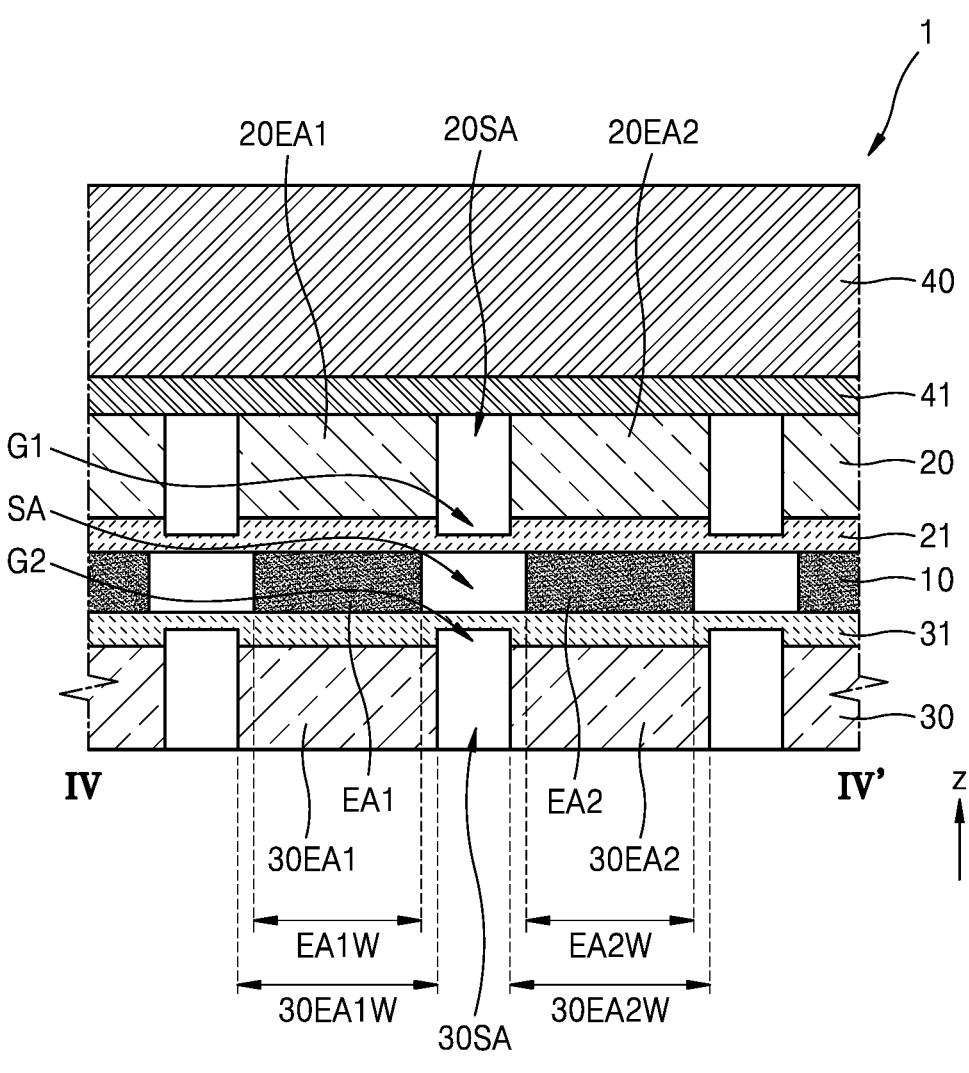
FIG. 16 is a cross-sectional view illustrating a display apparatus according to an embodiment.

Although FIG. 15 illustrates an embodiment where the lower organic layer 30 is integrally provided below the first extension area EA1, the second extension area EA2, and the separation area SA, the disclosure is not limited thereto. Alternatively, as shown in FIG. 16, which is a cross-sectional view schematically illustrating a portion of the display apparatus 1 according to an embodiment, in the lower organic layer 30, an empty space may exist between a portion below the first extension area EA1 and a portion below the second extension area EA2. In an embodiment, for example, a display apparatus manufactured by using a manufacturing method including an operation of preparing the display panel described above with reference to FIG. 9 may have the same structure as shown in FIG. 16.

The lower organic layer 30 as shown in FIG. 16 may include the first lower organic layer extension area 30EA1 and the second lower organic layer extension area 30EA2 in the corner area CNA. That is, the first lower organic layer extension area 30EA1 and the second lower organic layer extension area 30EA2 may be disposed below the corner area CNA of the display panel 10. The first lower organic layer extension area 30EA1 may overlap the first extension area EA1, and the second lower organic layer extension area 30EA2 may overlap the second extension area EA2.

The second lower organic layer extension area 30EA2 may be spaced apart from the first lower organic layer extension area 30EA1. The lower organic layer separation area 30SA may be defined between the first lower organic layer extension area 30EA1 and the second lower organic layer extension area 30EA2, which are adjacent to each other. The lower organic layer separation area 30SA may be an area in which the lower organic layer 30 is not arranged. That is, an empty space may exist between the first lower organic layer extension area 30EA1 and the second lower organic layer extension area 30EA2. The lower organic layer separation area 30SA may overlap the separation area SA.

In a cross-sectional view taken along a plane perpendicular to the display panel 10 and passing through the first lower organic layer extension area 30EA1, the second lower organic layer extension area 30EA2, the first extension area EA1, and the second extension area EA2, a separation distance between the first lower organic layer extension area 30EA1 and the second lower organic layer extension area 30EA2 may be less than or equal to a separation distance between the first extension area EA1 and the second extension area EA2. That is, in the cross-sectional view, as shown in FIG. 16, a width 30EA1W of the first lower organic layer extension area 30EA1 may be greater than or equal to a width EA1W of the first extension area EA1. In the cross-sectional view, as shown in FIG. 16, a width 30EA2W of the second lower organic layer extension area may be greater than a width EA2W of the second extension area EA2.

The lower organic layer adhesive layer 31 as shown in FIG. 16 may further include the second groove G2. The second groove G2 may be disposed on a lower surface (in a −z direction) of the lower organic layer adhesive layer 31. The second groove G2 may overlap the separation area SA. The second groove G2 may overlap the lower organic layer separation area 30SA.

According to embodiments of the invention as described above, a display apparatus, in which the possibility of occurrence of defects in a manufacturing operation thereof may be reduced, and a manufacturing method thereof are provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display apparatus, the method comprising:
   preparing a display panel, wherein a corner area of the display panel comprises a first extension area and a second extension area;
   attaching a guide film to the display panel;
   pre-shaping the display panel by applying an external force to the guide film; and
   attaching a cover window to the display panel,
   wherein the preparing the display panel comprises:
      attaching an upper organic layer, to which an upper organic layer adhesive layer is attached, to an upper surface of the display panel;
      forming a first upper organic layer extension area overlapping the first extension area, and a second upper organic layer extension area overlapping the second extension area, by cutting a portion of the upper organic layer on the corner area of the display panel using a laser beam; and
      attaching a lower organic layer, to which a lower organic layer adhesive layer is attached, to a lower surface of the display panel.

2. The method of claim 1, wherein the forming the first upper organic layer extension area and the second upper organic layer extension area comprises:
   forming the first upper organic layer extension area and the second upper organic layer extension area by cutting the upper organic layer along a separation area defined between the first extension area and the second extension area using the laser beam.

3. The method of claim 2, wherein the forming the first upper organic layer extension area and the second upper organic layer extension area comprises:
   forming a first groove on an upper surface of the upper organic layer adhesive layer by half-cutting the upper organic layer adhesive layer along the separation area using the laser beam.

4. The method of claim 1, wherein the preparing the display panel further comprises:
   forming a first lower organic layer extension area overlapping the first extension area, and a second lower organic layer extension area overlapping the second extension area, by cutting a portion of the lower organic layer below the corner area of the display panel using the laser beam.

5. The method of claim 4, wherein the forming the first lower organic layer extension area and the second lower organic layer extension area comprises:
   forming the first lower organic layer extension area and the second lower organic layer extension area by cutting the lower organic layer along a separation area defined between the first extension area and the second extension area using the laser beam.

6. The method of claim 5, wherein the forming the first lower organic layer extension area and the second lower organic layer extension area further comprises:

forming a second groove on a lower surface of the lower organic layer adhesive layer by half-cutting the lower organic layer adhesive layer along the separation area using the laser beam.

\* \* \* \* \*